(12) United States Patent
Keshtbod et al.

(10) Patent No.: US 8,542,524 B2
(45) Date of Patent: Sep. 24, 2013

(54) MAGNETIC RANDOM ACCESS MEMORY (MRAM) MANUFACTURING PROCESS FOR A SMALL MAGNETIC TUNNEL JUNCTION (MTJ) DESIGN WITH A LOW PROGRAMMING CURRENT REQUIREMENT

(75) Inventors: Parviz Keshtbod, Los Altos Hills, CA (US); Roger Klas Malmhall, San Jose, CA (US); Rajiv Yadav Ranjan, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 319 days.

(21) Appl. No.: 12/975,304

(22) Filed: Dec. 21, 2010

(65) Prior Publication Data

US 2011/0089511 A1    Apr. 21, 2011

Related U.S. Application Data

(63) Continuation-in-part of application No. 11/674,124, filed on Feb. 12, 2007, now Pat. No. 8,084,835, and a continuation-in-part of application No. 11/678,515, filed on Feb. 23, 2007, now Pat. No. 8,058,696, and a continuation-in-part of application No. 11/776,692, filed on Jul. 12, 2007, now Pat. No. 8,063,459.

(51) Int. Cl.
*G11C 11/00* (2006.01)
(52) U.S. Cl.
USPC .......... 365/158; 365/148; 365/171; 365/172; 977/935
(58) Field of Classification Search
USPC .......... 365/48, 55, 62, 66, 74, 78, 80–93, 365/100, 130, 131, 148, 158, 171–173, 209, 213, 225.5, 230.07, 232, 243.5; 257/295, 257/421, E21.665; 438/3; 977/933–935
See application file for complete search history.

(56) References Cited

U.S. PATENT DOCUMENTS 3,665,264 A    5/1972   Yukami et al.
5,060,098 A   10/1991   Gotoh et al.
(Continued)

FOREIGN PATENT DOCUMENTS

JP    2006295198    10/2006
JP    2007073971     3/2007

OTHER PUBLICATIONS

T. Sek et al.; Spin-polarized current-induced magnetization reversal in perpendicularly magnetized L10-FePt layers; Applied Physics Letters; 88, 172504 2006 ; Apr. 25, 2006.

(Continued)

*Primary Examiner* — Harry W Byrne
(74) *Attorney, Agent, or Firm* — Maryam Imam; IPxLaw Group LLP

(57) ABSTRACT

A method of making a magnetic random access memory cell includes forming a magnetic tunnel junction (MTJ) on top of a wafer, depositing oxide on top of the MTJ, depositing a photo-resist layer on top of the oxide layer, forming a trench in the photo-resist layer and oxide layer where the trench has a width that is substantially the same as that of the MTJ. Then, the photo-resist layer is removed and a hard mask layer is deposited on top of the oxide layer in the trench and the wafer is planarized to remove the portion of the hard mask layer that is not in the trench to substantially level the top of oxide layer and the hard layer on the wafer. The remaining oxide layer is etched and the MTJ is etched to remove the portion of the MTJ which is not covered by the hard mask layer.

3 Claims, 27 Drawing Sheets

(56) References Cited

U.S. PATENT DOCUMENTS

| | | | |
|---|---|---|---|
| 6,072,718 | A | 6/2000 | Abraham et al. |
| 6,169,689 | B1 | 1/2001 | Naji |
| 6,548,849 | B1* | 4/2003 | Pan et al. ............... 257/296 |
| 6,642,595 | B1 | 11/2003 | Hung et al. |
| 6,670,660 | B2 | 12/2003 | Hosotani |
| 6,697,294 | B1 | 2/2004 | Qi et al. |
| 6,709,942 | B2* | 3/2004 | Pan et al. ............... 438/381 |
| 6,724,585 | B2 | 4/2004 | Hayashi |
| 6,737,283 | B2* | 5/2004 | Morgan ............... 438/3 |
| 6,798,004 | B1* | 9/2004 | Grynkewich et al. ....... 257/295 |
| 6,806,096 | B1* | 10/2004 | Kim et al. ............... 438/3 |
| 6,905,578 | B1 | 6/2005 | Moslehi et al. |
| 6,985,385 | B2 | 1/2006 | Nguyen et al. |
| 7,001,783 | B2* | 2/2006 | Costrini et al. ............... 438/3 |
| 7,002,781 | B2 | 2/2006 | Sugawara |
| 7,023,725 | B2 | 4/2006 | Saito et al. |
| 7,087,438 | B2* | 8/2006 | Kasko et al. ............... 438/3 |
| 7,109,539 | B2 | 9/2006 | Lu |
| 7,579,197 | B1* | 8/2009 | Li ............... 438/3 |
| 7,732,881 | B2 | 6/2010 | Wang |
| 7,869,266 | B2 | 1/2011 | Ranjan et al. |
| 2002/0048128 | A1 | 4/2002 | Kamiguchi et al. |
| 2003/0108776 | A1 | 6/2003 | Chang et al. |
| 2003/0123200 | A1 | 7/2003 | Nagasaka et al. |
| 2003/0128483 | A1 | 7/2003 | Kamijo |
| 2003/0232223 | A1 | 12/2003 | Leddy et al. |
| 2004/0042128 | A1 | 3/2004 | Slaughter et al. |
| 2004/0124456 | A1* | 7/2004 | Morgan ............... 257/295 |
| 2004/0170055 | A1 | 9/2004 | Albert et al. |
| 2004/0201070 | A1 | 10/2004 | Deak |
| 2004/0211749 | A1* | 10/2004 | Grynkewich et al. ........... 216/2 |
| 2005/0045913 | A1 | 3/2005 | Nguyen et al. |
| 2005/0063222 | A1 | 3/2005 | Huai et al. |
| 2005/0105325 | A1 | 5/2005 | Haneda et al. |
| 2005/0130374 | A1* | 6/2005 | Grynkewich et al. ....... 438/257 |
| 2005/0167657 | A1 | 8/2005 | Nickel et al. |
| 2005/0195532 | A1 | 9/2005 | Sugiyama et al. |
| 2005/0201020 | A1 | 9/2005 | Fuke et al. |
| 2005/0207219 | A1 | 9/2005 | Lee et al. |
| 2005/0254287 | A1 | 11/2005 | Valet et al. |
| 2006/0017081 | A1 | 1/2006 | Sun et al. |
| 2006/0081953 | A1 | 4/2006 | Nguyen et al. |
| 2006/0083056 | A1 | 4/2006 | Daughton et al. |
| 2006/0109591 | A1 | 5/2006 | Ranjan et al. |
| 2006/0114620 | A1 | 6/2006 | Sbiaa et al. |
| 2006/0141640 | A1 | 6/2006 | Huai et al. |
| 2006/0239066 | A1 | 10/2006 | Liaw |
| 2007/0007609 | A1 | 1/2007 | Saito et al. |
| 2007/0164336 | A1 | 7/2007 | Saito et al. |
| 2007/0201265 | A1 | 8/2007 | Ranjan |
| 2007/0253245 | A1 | 11/2007 | Ranjan |
| 2008/0094886 | A1 | 4/2008 | Ranjan |
| 2008/0164548 | A1 | 7/2008 | Ranjan |
| 2008/0191251 | A1 | 8/2008 | Ranjan |
| 2008/0191295 | A1 | 8/2008 | Ranjan |
| 2008/0225585 | A1 | 9/2008 | Ranjan |
| 2008/0246104 | A1 | 10/2008 | Ranjan |
| 2008/0293165 | A1 | 11/2008 | Ranjan |
| 2009/0046501 | A1 | 2/2009 | Ranjan et al. |
| 2009/0109739 | A1 | 4/2009 | Ranjan |
| 2009/0227045 | A1* | 9/2009 | Li ............... 438/3 |
| 2010/0240152 | A1 | 9/2010 | Wang |

OTHER PUBLICATIONS

Yingfan, Xu et al.; In situ ordering of FePt thin films with face-centered-tetragonal 001 texture on Cr100AxRux underlayer at low substrate temperature; Applied Physics Letters, vol. 80, No. 18, May 6, 2002.

S. Mangin et al.; Current-induced magnetization reversal in nanopillars with perpendicular anisotropy; Nature Materials; Mar. 2005; vol. 5.

F. J. Albert, et al.; Quantitative Study of Magnetization Reversal by Spin-Polarized Current in Magnetic Multilayer Nanopillars; Physical Review Letters; vol. 89, No. 22; Nov. 25, 2002.

Hao Meng, et al.; Current Confined Effect of Magnet Nano-Current-Channel for Magnetic Random Access Memory; The Center for Micromagnetics and Information Technology; Oct. 31, 2006.

L. Berge; Emission of spin waves by a magnetic multilayer traversed by a current; Physical Review; Oct. 1, 1996; vol. 54, No. 13.

G. D. Fuchs, et al.; Spin Torque, Tunnel-Current Spin Polarization, and Magnetoresistance in MgO Magnetic Tunnel Junctions; Physical Review Letters; PRL 96, 186603 (2006); May 12, 2006.

Jun Hayakawa; Current-Driven Magnetization Switching in CoFeB/MgO/CoFeB Magnetic Tunnel Junctions; Japanese Journal of Applied Physics; vol. 44, No. 41, 2005, pp. L 1267-L 1270.

Hao Meng, et al.; Composite free layer for high density magnetic random access memory with lower spin transfer current; Applied Physics Letters 89, 152509; Oct. 12, 2006.

Hao Meng, et al.; Low critical current for spin transfer in magnetic tunnel junctions; Applied Physics Letters; 88; Feb. 23, 2006.

G. D. Fuchs; Spin-transfer effects in nanoscale magnetic tunnel junctions; Applied Physics Letters; vol. 85, No. 7; Aug. 16, 2004.

J.C. Slonezewski; Current-driven excitation of magnetic multi-layers; Journal of Magnetism and Magnetic Materials; Dec. 19, 1995.

G. Consolo, et al.; Spin-torque switching in Py/Cu/Py and Py/Cu/CoPt spin-valve nanopillars; Journal of Magnetism and Magnetic Materials; Mar. 23, 2007.

F. J. Albert; Spin-polarized current switching of a Co thin film nanomagnet; Applied Physics Letters; vol. 77, No. 23; Dec. 4. 2000.

Xiaochun Zhu; Spin Torque and Field-Driven Perpendicular MRAM Designs Scalable to Multi-Gb/Chip Capacity; , vol. 42, No. 10, Oct. 2006.

C. J. Sun, et al.; Epitaxial L1o FePt magnetic thin films sputtered on Cu (001); Applied Physics Letters; vol. 82, No. 12; Mar. 24, 2003.

J. A. Katine et al.; Current-Driven Magnetization Reversal and Spin-Wave Excitations in CoCuCo Pillars; Physical Review Letters; vol. 84; Apr. 3, 2000.

* cited by examiner

MAGNETIC RANDOM ACCESS MEMORY (MRAM) MANUFACTURING PROCESS FOR A SMALL MAGNETIC TUNNEL JUNCTION (MTJ) DESIGN WITH A LOW PROGRAMMING CURRENT REQUIREMENT

CROSS REFERENCE TO RELATED APPLICATIONS

This application is a continuation-in-part of U.S. patent application Ser. No. 11/674,124, entitled "Non-Uniform Switching Based Non-Volatile Magnetic Based Memory," filed Feb. 12, 2007 now U.S. Pat. No. 8,084,835, by Ranjan, et al.; U.S. patent application Ser. No. 11/678,515, entitled "A High Capacity Low Cost Multi-State Magnetic Memory," filed Feb. 23, 2007 now U.S. Pat. No. 8,058,696, by Ranjan, et al.; and U.S. patent application Ser. No. 11/776,692, entitled "Non-Volatile Magnetic Memory Element with Graded Layer," filed Jul. 12, 2007 now U.S. Pat. No. 8,063,459, by Ranjan et al., all of which are incorporated herein by reference as though set forth in full.

FIELD OF THE INVENTION

The present invention relates generally to non-volatile magnetic random access memory and particularly to a method for manufacturing memory cells for non-volatile magnetic random access memory incorporating a small magnetic tunnel junction (MTJ).

DESCRIPTION OF THE PRIOR ART

Computers conventionally use rotating magnetic media, such as hard disk drives (HDDs), for data storage. Though widely used and commonly accepted, such media suffer from a variety of deficiencies, such as access latency, higher power dissipation, large physical size and inability to withstand any physical shock. Thus, there is a need for a new type of storage device devoid of such drawbacks.

Other dominant storage devices are dynamic random access memory (DRAM) and static RAM (SRAM) which are volatile and very costly but have fast random read/write access time. Solid state storage, such as solid-state-nonvolatile-memory (SSNVM) devices having memory structures made of NOR/NAND-based Flash memory, providing fast access time, increased input/output (IOP) speed, decreased power dissipation and physical size and increased reliability but at a higher cost which tends to be generally multiple times higher than hard disk drives (HDDs).

Although NAND-based flash memory is more costly than HDD's, it has replaced magnetic hard drives in many applications such as digital cameras, MP3-players, cell phones, and hand held multimedia devices due, at least in part, to its characteristic of being able to retain data even when power is disconnected. However, as memory dimension requirements are dictating decreased sizes, scalability is becoming an issue because the designs of NAND-based Flash memory and DRAM memory are becoming difficult to scale with smaller dimensions. For example, NAND-based flash memory has issues related to capacitive coupling, few electrons/bit, poor error-rate performance and reduced reliability due to decreased read-write endurance. Read-write endurance refers to the number of reading, writing and erase cycles before the memory starts to degrade in performance due primarily to the high voltages required in the program, erase cycles.

It is believed that NAND flash, especially multi-bit designs thereof, would be extremely difficult to scale below 45 nanometers. Likewise, DRAM has issues related to scaling of the trench capacitors leading to very complex designs which are becoming increasingly difficult to manufacture, leading to higher cost.

Currently, applications commonly employ combinations of EEPROM/NOR, NAND, HDD, and DRAM as a part of the memory in a system design. Design of different memory technology in a product adds to design complexity, time to market and increased costs. For example, in hand-held multi-media applications incorporating various memory technologies, such as NAND Flash, DRAM and EEPROM/NOR flash memory, complexity of design is increased as are manufacturing costs and time to market. Another disadvantage is the increase in size of a device that incorporates all of these types of memories therein.

There has been an extensive effort in development of alternative technologies such as Ovanic Ram (or phase-change memory), Ferromagnetic Ram (FeRAM), Magnetic Ram (MRAM), Nanochip, and others to replace memories used in current designs such as DRAM, SRAM, EEPROM/NOR flash, NAND flash and HDD in one form or another. Although these various memory/storage technologies have created many challenges, there have been advances made in this field in recent years. MRAM seems to lead the way in terms of its progress in the past few years to replace all types of memories in the system as a universal memory solution. MRAM provides the advantages of a high density memory, non-volatility and low power consumption.

MRAM presently faces scalability challenges. For wide adoption of MRAM as a universal memory solution, MRAM technology must be scaled down. Generally, smaller memory cells have the advantageous benefits of placing more memory cells in the same physical space, and the memory is likely to be faster.

A magnetic memory cell is comprised of two components; a magnetic tunnel junction (MTJ) and an access transistor.

A MTJ further consists of two layers of magnetic metal, such as cobalt-iron, separated by an ultrathin layer of insulator, made of magnesium oxide, with a thickness of about 1 nm. The insulating layer is so thin that electrons can tunnel through the barrier if a bias voltage is applied between the two metal electrodes. In MTJs the tunneling current depends on the relative orientation of magnetizations of the two magnetic metal layers, which can be changed by an applied magnetic field. This phenomenon is called tunneling magneto-resistance (TMR).

The access transistor consists of a source drain and a gate. An n-channel field-effect transistor (FET) is commonly used for accessing the MTJ.

The basic concept of MRAM is to use the magnetization direction in MTJs for information storage. "0" and "1" correspond to parallel and anti-parallel magnetizations orientation in a MTJ. The information bits can be written by passing a current through a MTJ, and they can be read out by measuring the resistance of the MTJ in comparison to a reference resistor or voltage or current. MRAM provides the advantages of a high density, non-volatility and low power consumption.

For MRAM to be competitive with other forms of alternative RAM technologies, especially DRAM, the MTJ must be made very small. Smaller MTJs advantageously program with smaller currents and produce smaller cell size. However, smaller MTJ designs are not without problems. Since a MTJ can be defined as a small island, a similarly small piece of photo-resist (PR) needs to be defined for the definition of the MTJ. Such a small resist column is very unstable, and is susceptible to easily toppling over. At the same time defining photo-resist columns or pillars are difficult and unreliable. It is difficult to reliably and consistently define oval shaped MTJs, without a big size variations and rough edges. Therefore it is important to find a way to change the mask polarity, and to define MTJs as holes in the photo-resist other than long columns. Another problem with having small MTJ size is that since they are at or smaller than the minimum design rule, one can not connect to them with s simple Via.

The area of the MTJ controls how much programming current is required. The larger the area of the MTJ the more programming current needed. Thus, it is advantageous to minimize the size of the MTJ in an effort to reduce its programming current requirement. The programming current is generally supplied to the MTJ by an access transistor coupled to the MTJ. To reduce the area of the MTJ, the length and width of the MTJ may be decreased, but an aspect ratio (the ratio of length to width) is typically greater than one. As the aspect ratio increases, so does the coercive field (Hc). A higher coercive field makes the MTJ more stable with time and temperature, but at the same time increases the required programming current. In fact, the relationship of time to de-stability t to Hc can be written as:

$$t=t0\exp(D) \text{ where } D=Hc*V/KT \quad \text{Eq. (1)}$$

In this equation V is the volume of the free layer, T is the temperature in degrees Kelvin, K is the Boltezman's constant and t0 is around 1 nSec. For example, if the length and width of the MTJ are 85 and 60 nanometers respectively and MTJ thickness is 3 nanometers, then Hc=85 Oersted and D=50 at room temperature. With a MTJ of these dimensions (85×60 nanometers) it will take more than 100 years for this device to go unstable. Increasing aspect ratio will increase the coercive field, but at the same time makes the device more difficult to program with current.

Thus, the need arises for a manufacturing method for magnetic memory cells which yields a small substantially pillar-shaped MTJ design with a low programming current requirement.

BRIEF SUMMARY OF THE INVENTION

Briefly, a method of the present invention includes A method of making a magnetic random access memory cell includes forming a magnetic tunnel junction (MTJ) on top of a wafer, depositing oxide on top of the MTJ, depositing a photo-resist layer on top of the oxide layer, forming a trench in the photo-resist layer and oxide layer where the trench has a width that is substantially the same as that of the MTJ. Then, the photo-resist layer is removed and a hard mask layer is deposited on top of the oxide layer in the trench and the wafer is planarized to remove the portion of the hard mask layer that is not in the trench to substantially level the top of oxide layer and the hard layer on the wafer. The remaining oxide layer is etched and the MTJ is etched to remove the portion of the MTJ which is not covered by the hard mask layer.

The foregoing and other objects, features and advantages of the present invention will be apparent from the following detailed description of the preferred embodiments which make reference to several figures of the drawing.

DETAILED DESCRIPTION

To overcome the limitations in the prior art described above, and to overcome other limitations that will become apparent upon reading and understanding the present specification, the present invention discloses a manufacturing method for magnetic memory cells yielding a small MTJ design with a low programming current requirement.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of embodiments of the present invention.

Figure 1:
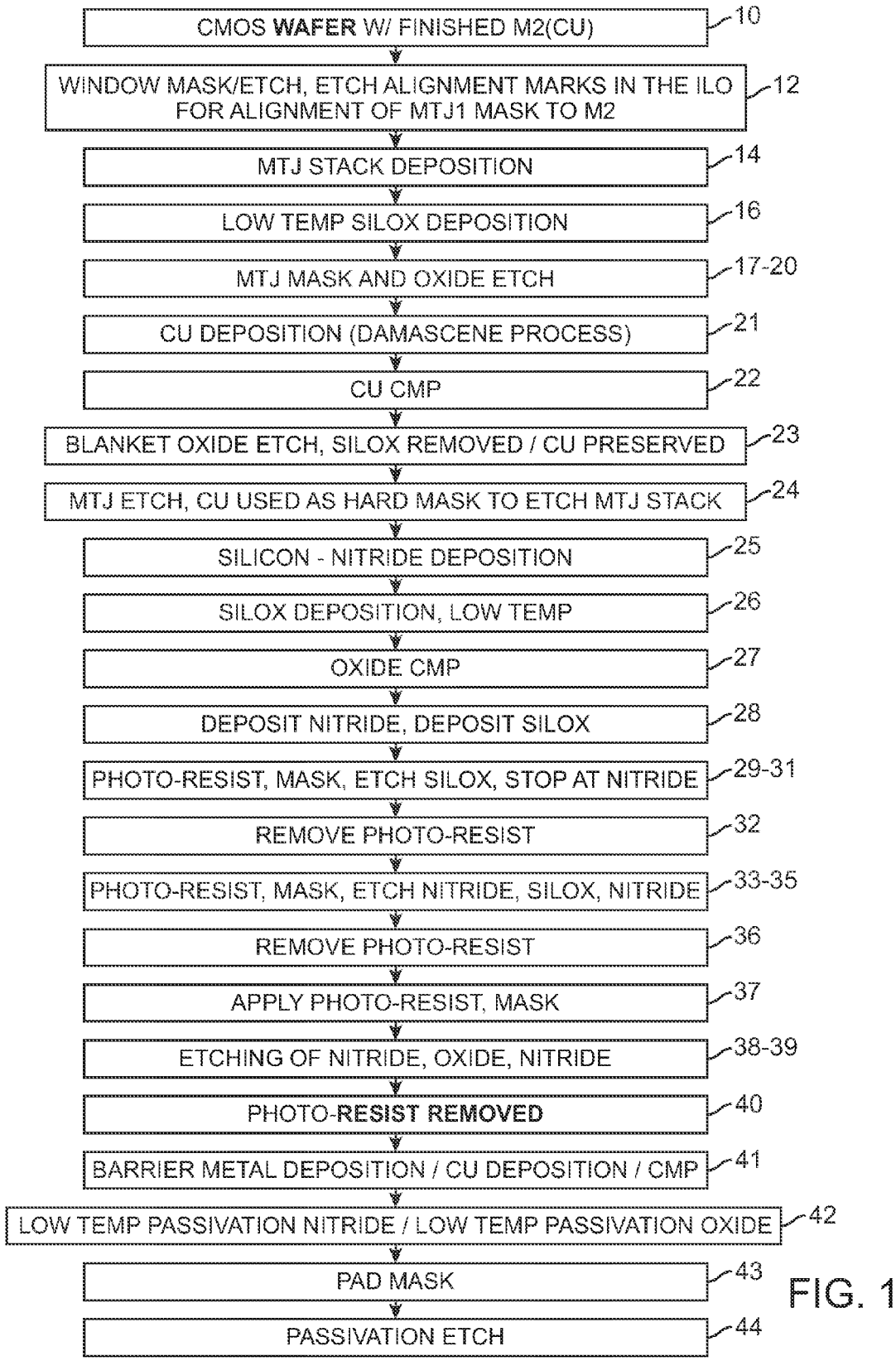
FIG. 1 shows a flow-chart of the MRAM manufacturing process 100 used to manufacture magnetic memory cells.

Referring now to FIG. 1, shows a flow-chart of the MRAM manufacturing process 100 used to manufacture magnetic memory cells. In manufacturing MRAMs, a complimentary metal-oxide-semiconductor (CMOS) as well as logic or magnetic manufacturing processes are employed. That is, the magnetic memory is manufactured using magnetic processes and the logic or transistors used to cause connection with the magnetic memory and other logic for addressing and/or reading and writing to the magnetic memory is manufactured generally using CMOS processes. A plurality of these cells are constructed simultaneously on a single silicon wafer using the MRAM manufacturing process 100 of FIG. 1. FIGS. 2-18 show cross sections of a single magnetic memory cell as it progresses from Steps 18-43.

FIG. 1 is shown to include a Step 10, during which a CMOS wafer is formed with a dielectric layer. A conductive layer, or M2 layer, is also formed in Step 10. The formation of this conductive layer (M2 layer) may be done by ion beam deposition, electron beam evaporation, sputtering, or by the Cu damascene process. It is noted that other appropriate methods are known to one skilled in the art. In one embodiment of the present invention, the conductive layer is Copper (Cu). Alternatively, the conductive layer may also be made from tungsten, cobalt, titanium, or any other refractory metal, as traditionally used for making contacts.

At step 12, alignment marks are etched in the inter-layer dielectric (ILD) for alignment of the MTJ1 mask to the conductive layer (M2 layer). To form the MTJ, the conductive layer is covered by several metallic layers. Although these layers are very thin, they form an opaque layer, which makes it difficult to see the underlying conductive layer and align the MTJ to the conductive layer. To overcome this problem, a mask and etch technique called a window mask is used. The mask is loosely aligned to the conductive layer, and by etching the oxide around the conductive layer, it creates a depression around the conductive layer in the appropriate MTJ alignment marks, making the metal edges of the conductive layer clearly visible after the deposition of the MTJ layers. Etching of the alignment marks uses the etch-back process, in which photo-resist is applied overtop the layer to be patterned. In an exemplary embodiment of the present invention, a positive photo-resist process is used. In the positive photo-resist process, first a photo-resist layer is applied atop the dielectric layer. Next, the photo-resist layer is exposed to ultraviolet (UV) light, which changes the chemical structure of the photo-resist, making it soluble in a developer. After development, the photo-resist layer shows the opposite pattern which is to remain after etching. Step 12 further includes oxide etching in which the unwanted dielectric layer is etched away. Plasma etching may be achieved in two possible ways: a physical process method and an assisted physical process method. In the physical process method no chemical agent is employed and there removal of unwanted material is completed by the physical impact of the ions knocking atoms off the material surface by physical force alone. This is called ion milling. In the assisted physical process method, (for example, reactive ion etching (RIE)) removal of material results from a combination of chemical reactions and physical impact. Most commonly, ions are accelerated by a voltage applied to gas plasma in a vacuum. The effect of the ion impact is assisted by the introduction of a chemical which reacts with the surface being etched. Reactive ion etching (RIE), is an example of the assisted physical process method. In an exemplary embodiment of the present invention, RIE is used to etch alignment marks in the ILD alignment of the MTJ1 mask to the dielectric layer. Commonly, for RIE, the combination of a fluorine gas (like $CF_4$), $Cl_2$, $O_2$, and argon (Ar) are used. The use of RIE allows for substantially precise removal of the unwanted portions of the dielectric layer, without substantially significant unwanted etching of the underlying silicon wafer.

At Step 14, MTJ stack is deposited. The MTJ stack is deposited atop the dielectric layer and on top of conductive layer (M2 layer). A minimum amount of copper (Cu) and a minimum amount of tantalum (Ta), typically below 100 nm, is then applied atop the MTJ stack. The Cu is used as a seed for depositing Cu by electrolysis. Tantalum is hard material used for connecting to the MTJ and used as hard mask for etching the MTJ layers. It also isolates the MTJ layer from the other layers on top, in a way that minimizes the impact of the layers on top to the magnetic layers. As alternatives to tantalum, other metals can also be used instead, and include titanium (Ti), ruthenium (Ru), RuCu, and most refractory metals. The MTJ stack includes a pinning layer, on top of which is formed a tunnel layer, and further on top of which is formed a free layer. The MTJ stack layers is further discussed in U.S. patent application Ser. No. 11/674,124, entitled "Non-Uniform Switching Based Non-Volatile Magnetic Based Memory," filed Feb. 12, 2007, by Ranjan, et al.; U.S. patent application Ser. No. 11/678,515, entitled "A High Capacity Low Cost Multi-State Magnetic Memory," filed Feb. 23, 2007, by Ranjan, et al.; and U.S. patent application Ser. No. 11/776,692, entitled "Non-Volatile Magnetic Memory Element with Graded Layer," filed Jul. 12, 2007, by Ranjan et al., all of which are incorporated herein by reference as though set forth in full.

At Step 16, an oxide layer is deposited atop the tantalum layer. The oxide layer may be deposited using chemical vapor deposition (CVD), sputtering, or any other appropriate method. In an exemplary embodiment of the present invention, silicon dioxide ($SiO_2$), also known as SilOx, is used for the oxide layer. In another exemplary embodiment of the present invention, the thickness of the silicon dioxide layer is approximately 1500 Angstroms thick. In one embodiment, the silicon dioxide layer may alternatively be made of silicon nitride.

At Step 17, a photo-resist layer is deposited atop substantially the entire surface of first oxide layer.

At Step 18, a portion of the photo-resist layer is removed to form a trench.

At Step 19, the oxide layer is etched, using the partial trench to access the oxide layer, to form a trench.

At Step 20, the memory cell 102 is ashed to remove the remaining photo-resist layer.

At Step 21, a hard mask layer is deposited. In an exemplary embodiment of the present invention, at Step 21 the hard mask layer is copper, and the Electrolysis Process is used for deposition. In this process, the underlying silicon dioxide is patterned with open trenches where the conductor will be located. A thick coating of copper that significantly overfills the trenches is deposited on the insulator, and chemical-mechanical planarization or chemical-mechanical polishing (CMP) is used to remove the copper to the level of the top of the insulating layer. Copper sunken within the trenches of the insulating layer is not removed and becomes the patterned conductor.

At Step 22, a hard mask layer and an oxide layer are planarized. The planarization process is used to smooth the top surface of the hard mask layer, and make it level with the oxide layer. In an exemplary embodiment of the present invention, CMP is used to remove the copper to the level of the top of the silicon dioxide layer.

At Step 23, oxide is etched, removing the oxide layer, while leaving the hard mask layer. In an embodiment of the present invention, the silicon dioxide is removed while the copper is preserved.

At Step 24, the MTJ stack undergoes etching to remove MTJ areas not covered by the hard mask layer.

At Step 25, a shielding layer is deposited atop the memory cell. In one embodiment of the present invention, silicon-nitride is used as the shielding layer. In yet another embodiment of the present invention, the silicon-nitride layer is 1500 Angstroms thick.

At Step 26, a portion of the Silicon-Nitride layer is substantially reduced and flattened by a planarization process. In one exemplary embodiment of the present invention, CMP is used to remove a portion of and level the Silicon Nitride layer.

At Step 27, a second oxide layer is deposited on top of the shielding layer. In one exemplary embodiment of the present invention, Step 26 is performed using a low temperature, silicon dioxide deposition.

At Step 28, a second shielding layer is deposited, followed by the deposition of a third oxide layer. In an exemplary embodiment of the present invention, 100 Angstroms (A) to 1,000 A of nitride is used as a second shielding layer and silicon-dioxide is used as a third oxide layer. The silicon-dioxide layer is approximately 3000 A thick.

At Step 29, a second photo-resist layer is applied to areas of the memory cell which are to be protected from the following etching process.

At Step 30, a portion of the second photo-resist layer is removed to form two partial trenches.

At Step 31, the third oxide layer is etched, using the two partial trenches and to access the third oxide layer, to form two trenches.

At Step 32, the memory cell is exposed to remove the remaining second photo-resist layer 99.

At Step 33, a third photo-resist layer is deposited atop substantially the entire surface of the memory cell.

At Step 34, a partial trench is formed down through the third photo-resist layer, stopping at the top of the second shielding layer.

At Step 35, a trench is formed by etching the second shielding layer, second oxide layer, and shielding layer.

At Step 36, the third photo-resist layer, is ashed to remove the remaining layer of the third photo-resist layer.

At Step 37, a fourth photo-resist layer is deposited atop the second shielding layer and the third oxide layer, as well as the exposed portion of the conductive layer 80.

At Step 38, a partial trench is formed down through the fourth photo-resist layer, stopping at the second shielding layer.

At Step 39, the second shielding layer and the second oxide layer are etched, using the partial trench to access the second shielding layer and the second oxide layer to form a trench.

At Step 40, the fourth photo-resist layer is removed.

At Step 41, a barrier metal layer is deposited and a second conductive layer is deposited by electrolysis. This layer is most commonly copper, and CMP is used to substantially level and remove the excess Cu. This process leaves Cu only in the trenches.

At Step 42, a passivation nitride layer and a passivation oxide layer are deposited. Both depositions are applied in low temperature. The deposition temperature is below 300 C.

At Step 43, a pad mask is applied.

At Step 44, a passivation mask and a passivation etch are applied.

The MRAM manufacturing process 100 of FIG. 1 advantageously creates a small MTJ, on the scale of approximately 600 Angstroms wide, a heretofore unobtainable size. A MTJ of such a size benefits from having a lower programming current requirement, which can be supplied by the access transistor.

Figure 2:
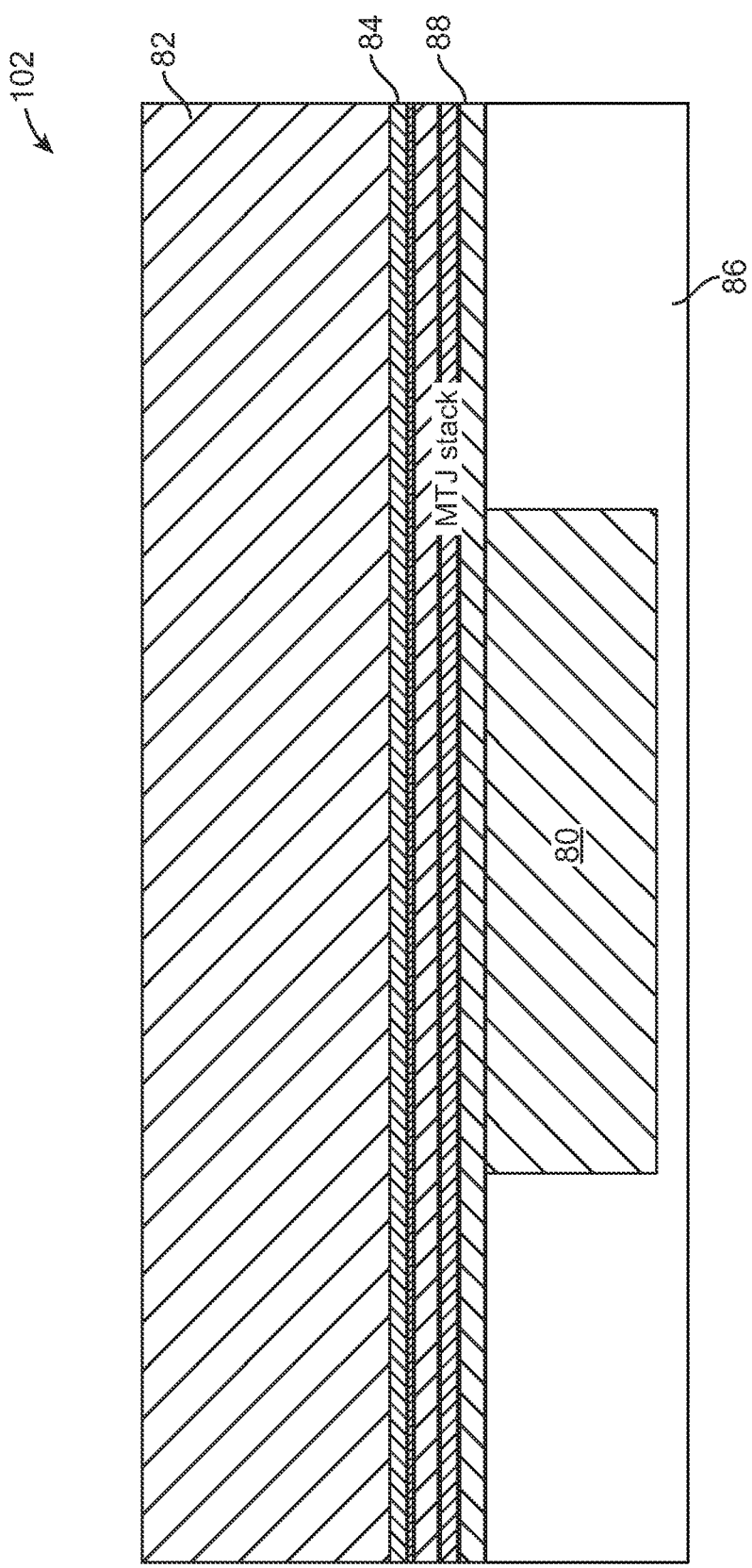
FIG. 2 shows a cross sectional view of a single memory cell 102 after Step 16 is completed.

FIG. 2 shows a cross sectional view of a single memory cell 102 after Step 16 (of FIG. 1) is completed. The formation of memory cell 102 up to Step 16 is well known to those skilled in the art. Memory cell 102 is shown to include CMOS wafer 86, conductive layer 80, MTJ stack 88, tantalum layer 84, and oxide layer 82.

At Step 16, oxide layer 82 is deposited atop tantalum layer 84. Oxide layer 82 is deposited using a low temperature technique. The low temperature technique is used to deposit the oxide layer 82 since high temperature disturbs the magnetic layers. The oxide layer 82 is only used to generate a hard mask to form a copper hard mask for the purpose of the MTJ definition. A variety of material can be used for this purpose. This includes any material that can be deposited at low temperature and can be removed easily. In an alternative embodiment of the present invention, photoresist is used instead of oxide layer 82. By using photoresist, the MRAM manufacturing process 100 of FIG. 1 can be shortened substantially. In those embodiments where a photoresist layer is used for the definition of the MTJ hard mask, steps 16, 22, and 24 can be eliminated.

In FIG. 2, the conductive layer 80 is shown to be Cu damascene fabricated as part of CMOS wafer 86. MTJ stack 88 is formed to substantially cover the top of the conductive layer 80 and the exposed upper area of CMOS wafer 86. Tantalum layer 84 is formed to substantially cover the top of the MTJ stack 88. Finally, oxide layer 82 is formed to substantially cover the top of the tantalum layer 84. In an exemplary embodiment of the present invention, silicon dioxide (SilOx or $SiO_2$) is used to form oxide layer 82, and oxide layer 82 is approximately 1500 Angstroms thick.

Figure 3A:
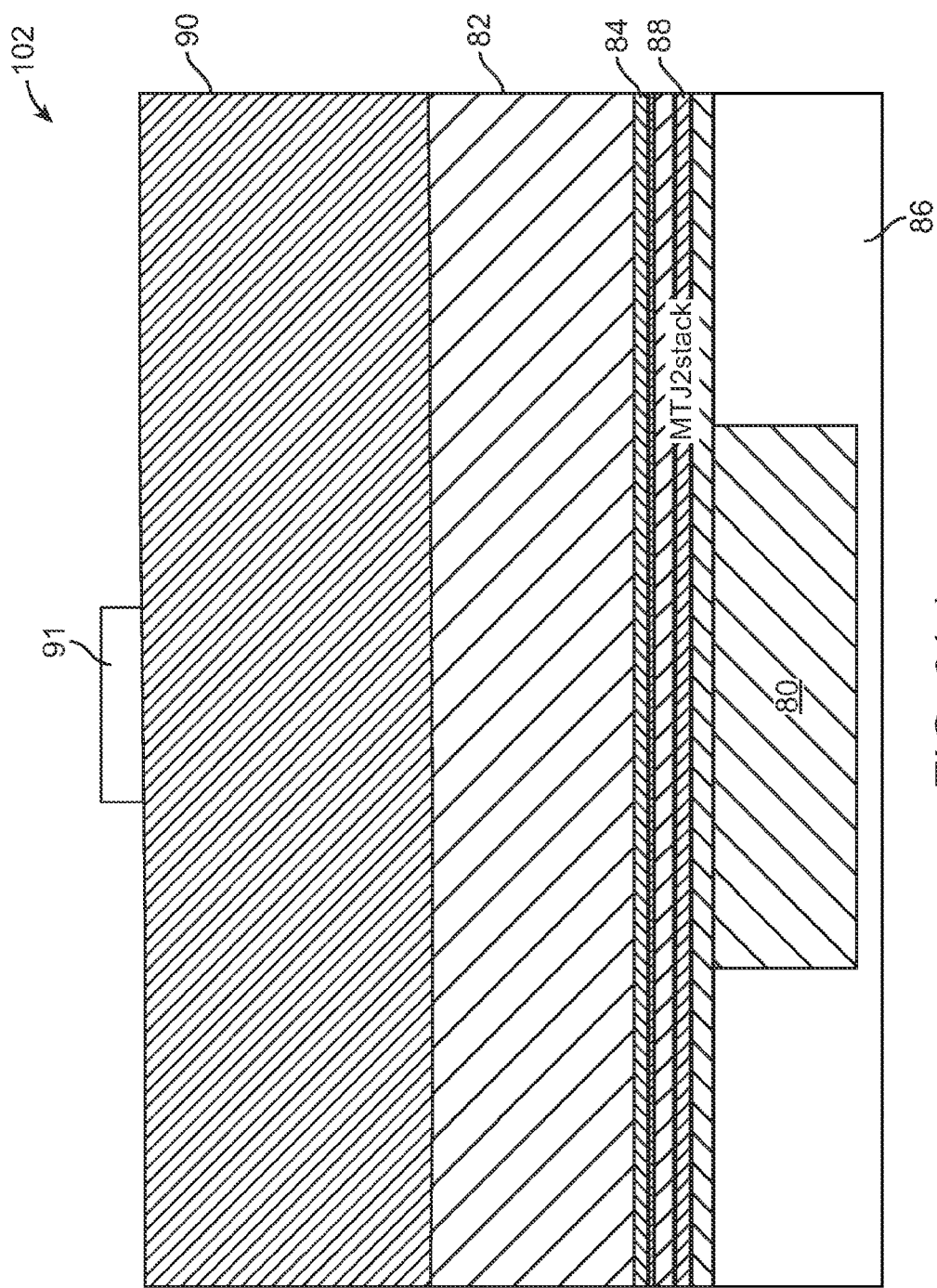
FIG. 3(a) shows a cross sectional view of memory cell 102 after Step 17 is completed.

FIG. 3(a) shows a cross sectional view of a single memory cell 102 after Step 17 (of FIG. 1) is completed. Memory cell 102 is shown to include CMOS wafer 86, conductive layer 80, MTJ stack 88, tantalum layer 84, oxide layer 82, photo-resist layer 90, and mask layer 91.

At Step 17, photo-resist layer 90 is deposited atop substantially the entire surface of oxide layer 82. The photo-resist layer 90 is then selectively exposed.

Accordingly, the photo-resist layer 90 is selectively exposed with the exposed area defined by the mask layer 91. Exposure is done using known techniques, such as using the ASML 193 nm stepper machine, made by ASML of the Netherlands. This selective exposure defines which areas of the photo-resist layer 90 are removed. If positive photo resist is used the exposed area of the photo resist would develop away and is removed.

Figure 3B:
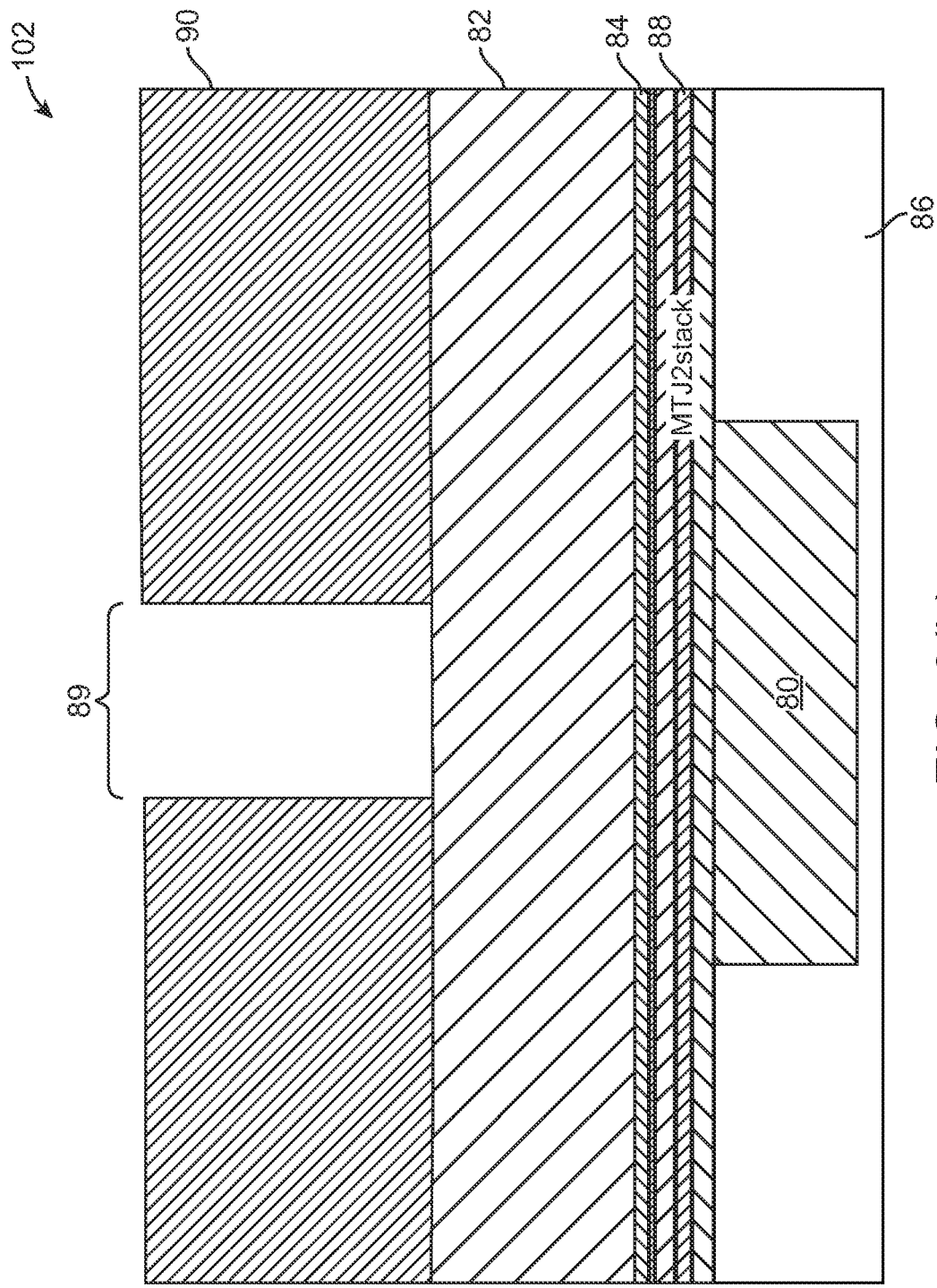
FIG. 3(b) shows a cross sectional view of memory cell 102 after Step 18 is completed.

FIG. 3(b) shows a cross sectional view of a single memory cell 102 after Step 18 (of FIG. 1) is completed. Memory cell 102 is shown to include CMOS wafer 86, conductive layer 80, MTJ stack 88, tantalum layer 84, oxide layer 82, photo-resist layer 90, and partial trench 89.

At Step 18, a portion of the photo-resist layer 90 is removed to form partial trench 89. Partial trench 89, is formed by removing the portion of photo-resist layer 90, and is formed substantially in the center of memory cell 102. Further, partial trench 89 is formed such that the top of oxide layer 82 is exposed, and layer 82 forms the bottom of partial trench 89.

Figure 3C:
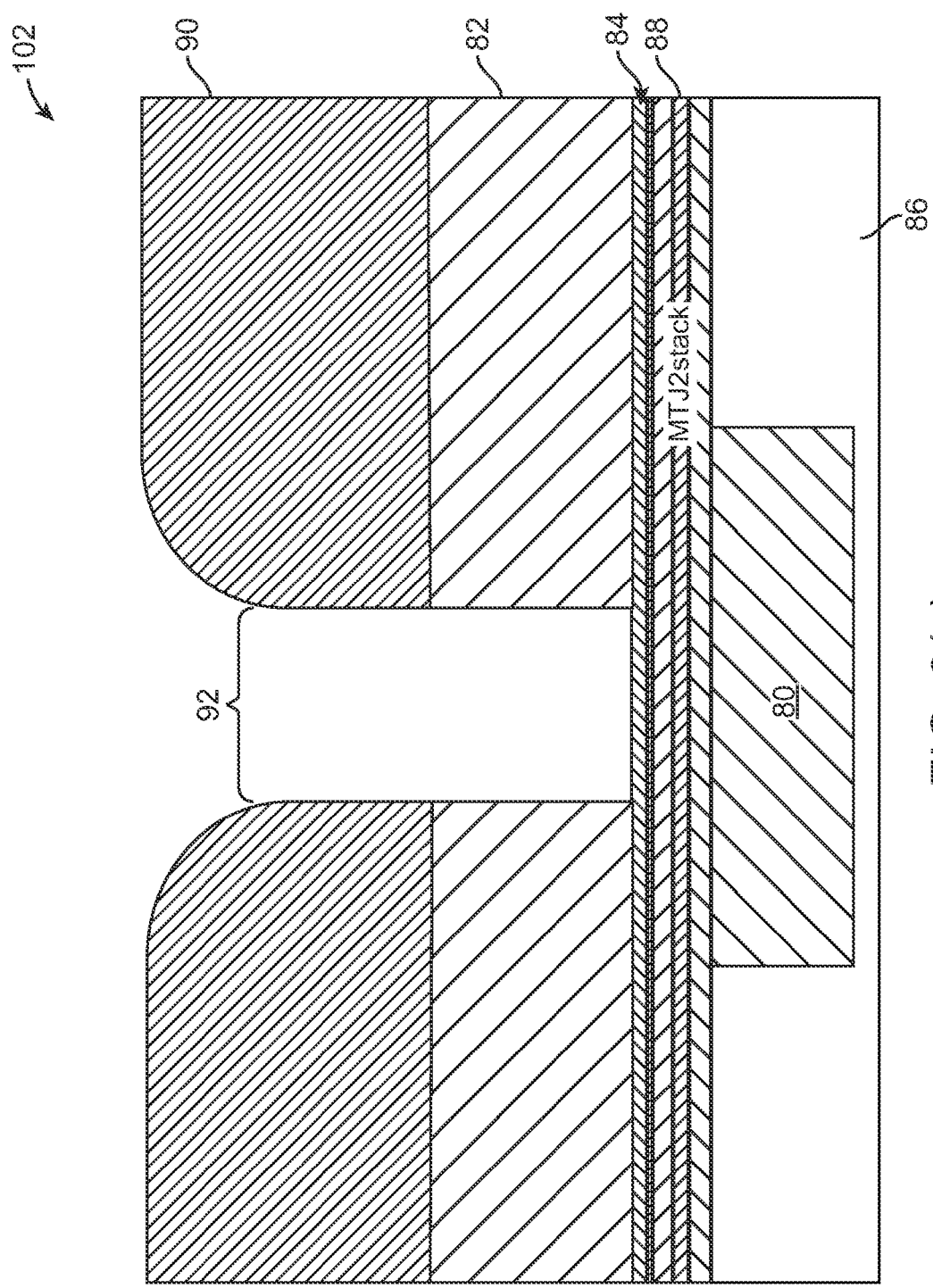
FIG. 3(c) shows a cross sectional view of memory cell 102 after Step 19 is completed.

FIG. 3(c) shows a cross sectional view of memory cell 102 after Step 19 (of FIG. 1) is completed. Memory cell 102 is shown to include CMOS wafer 86, conductive layer 80, MTJ stack 88, tantalum layer 84, oxide layer 82, photo-resist layer 90, and trench 92.

At Step 19, the oxide layer 82 is etched, using the partial trench 89 to access the oxide layer 82, to form trench 92. Trench 92, is formed from the photo-resist layer 90 down through the oxide layer 82 and stops at the tantalum layer 84. Trench 92 is located in substantially the center of memory cell 102. The top of the tantalum layer 84 forms the bottom of trench 92. In some embodiments, etching is performed using tetra-Fluoro-Carbon ($CF_4$) with reactive ion etching (RIE). Etching the oxide layer 82 stops at tantalum layer 84 since Ta etches much slower than oxide in CF4. In exemplary embodiment of the present invention, the area of trench 92 is approximately 5525 $nm^2$.

Figure 3D:
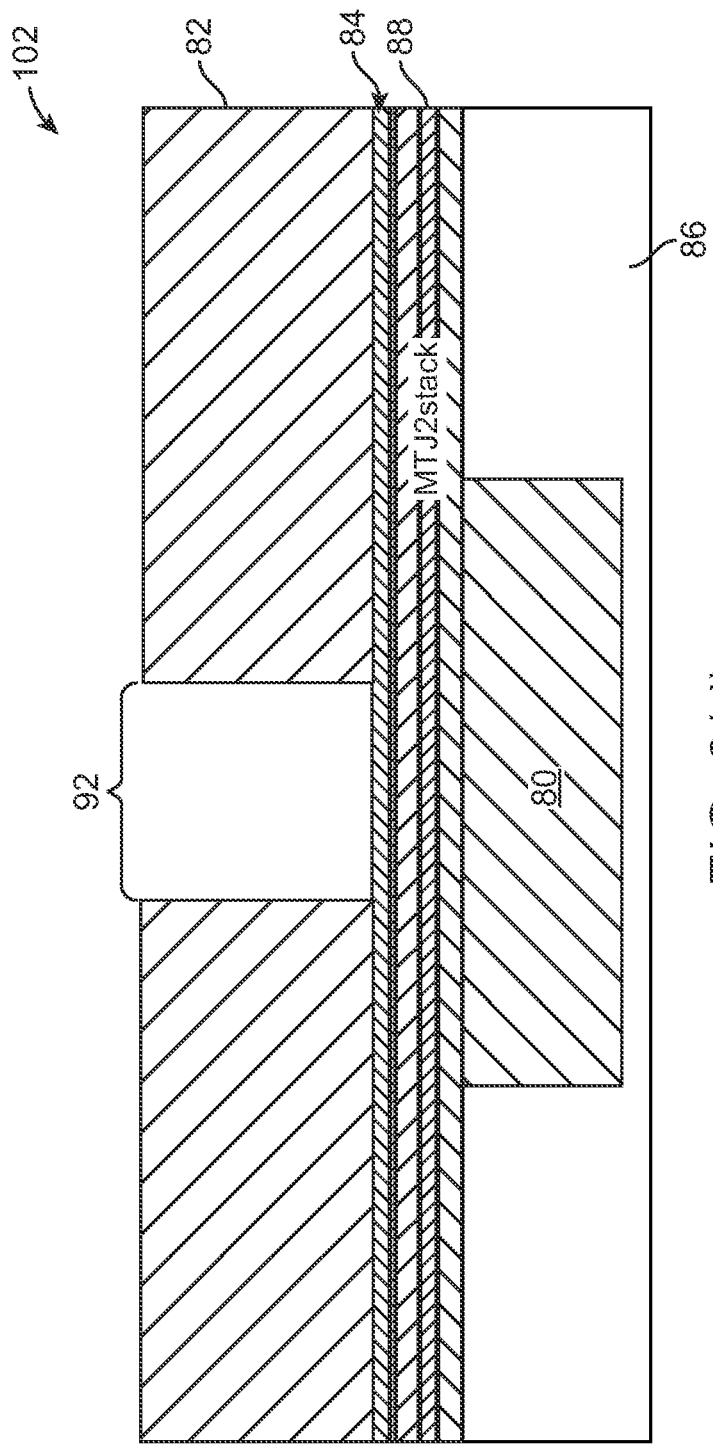
FIG. 3(d) shows a cross sectional view of memory cell 102 after Step 20 is completed.

At Step 20, the memory cell 102 is ashed in O2 plasma to remove the remaining photo-resist layer 90. This is an exemplary of the present invention, other techniques other than plasma ashing can be used to remove the remaining photo-resist layer 90. FIG. 3(d) shows memory cell 102 following the plasma ashing of the photoresist layer 90. It should be noted that in a yet another embodiment the oxide layer 82 is removed and the photoresist layer 90 is formed directly on top of layer 82.

Figure 4:
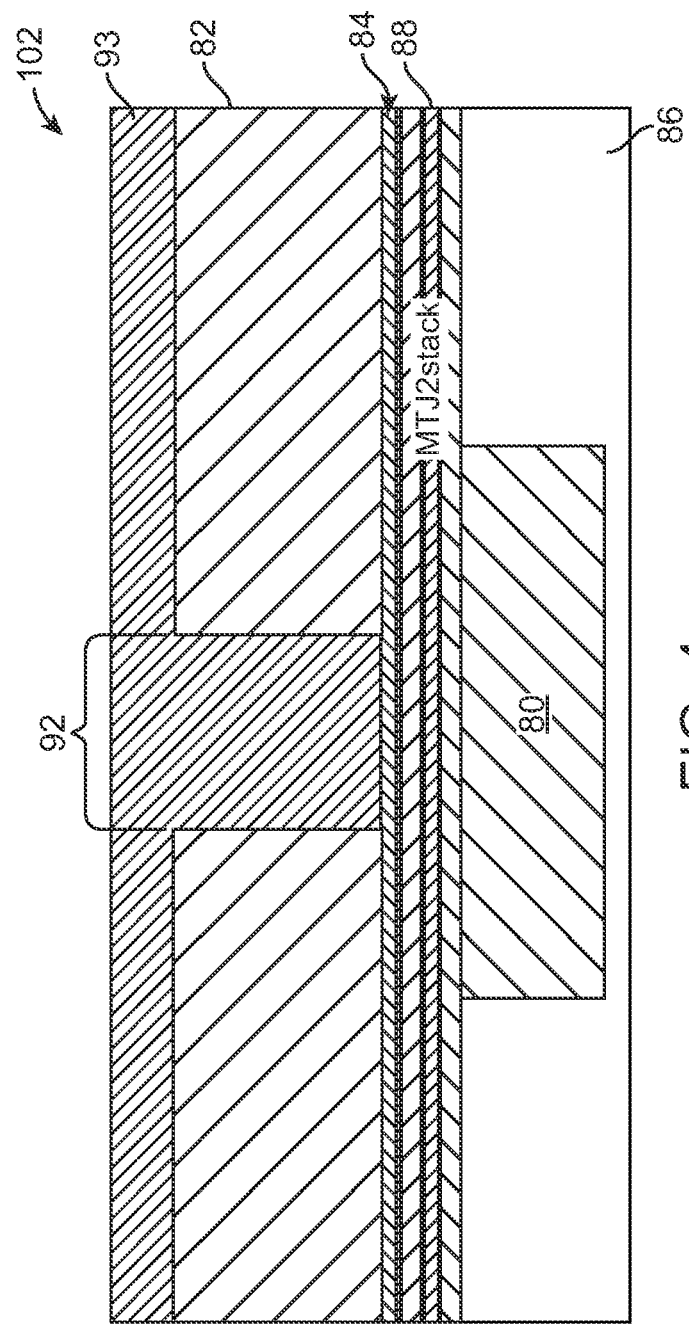
FIG. 4 shows a cross sectional view of a memory cell 102 after Step 21 is completed.

FIG. 4 shows a cross sectional view of a single memory cell 102 after Step 21 (of FIG. 1) is completed. Memory cell 102 is shown to include CMOS wafer 86, conductive layer 80, MTJ stack 88, tantalum layer 84, oxide layer 82, oxide mask layer 93, and trench 92.

At Step 21, a hard mask layer is deposited. In an exemplary embodiment of the present invention, the hard mask layer is copper, and the Damascene Process is used for deposition. In this process, the underlying oxide layer 82 is patterned with open trenches where the hard mask layer 93 is deposited. A thick coating of the hard mask layer 93, that significantly overfills the trench 92 is deposited on the oxide layer 82. In one embodiment of the present invention, the hard mask layer is copper. Thereafter, a chemical-mechanical planarization or chemical-mechanical polishing (CMP) is used to remove the copper to the level of the top of the oxide layer (at Step 22, and shown in FIG. 5). The hard mask layer 93 sunken within the trench 92 of the oxide layer is not removed and becomes the patterned conductor. The hard mask layer 93 is shown formed inside of the trench 92 and on top thereof and also on top of the oxide layer 82.

In an exemplary embodiment of the present invention, trench 92 is approximately 650 Angstroms wide. This size is advantageously smaller than that of prior art. In prior art techniques, when resist pillar is used to etch the MTJ, the trench can not be very small, since an MTJ pillar with a very small base would topple over and would etch away during MTJ etch.

In another embodiment of the present invention, the hard mask layer 93 is made of tungsten (W), titanium (Ti), titanium nitride (TiN), or tantalum (TaNi) or any suitable metal of which contacts may be made. The MTJ may be alternatively embedded and made on any of the metal layers of the memory cell, such as but not limited to, M1, M2, . . . or embedded memory of system-on-chip (SOC).

Figure 5:
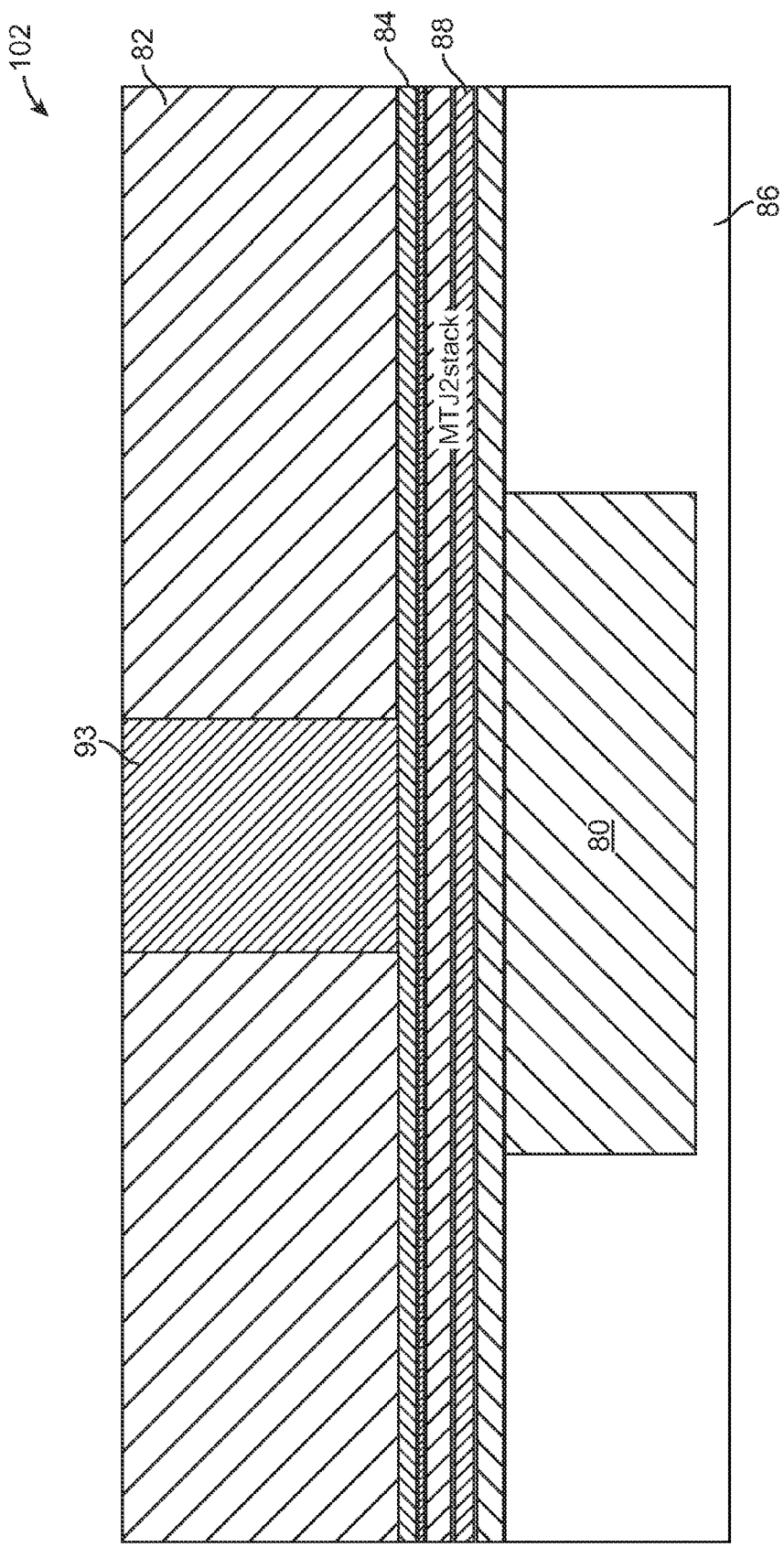
FIG. 5 shows a cross sectional view of memory cell 102 after Step 22 is completed.

FIG. 5 shows a cross sectional view of memory cell 102 after Step 22 (of FIG. 1) is completed. Memory cell 102 is shown to include CMOS wafer 86, conductive layer 80, MTJ stack 88, tantalum layer 84, oxide layer 82, hard mask layer 93, and trench 92. After Step 22, as a result of the chemical-mechanical polishing (CMP) process, the hard mask layer 93 is only present in trench 92, and the hard mask layer 93 is substantially leveled such that it forms a substantially leveled single surface with oxide layer 82.

At Step 22, the hard mask layer 93 and oxide layer 82 are planarized. The planarization process is used to smooth the top surface of the hard mask layer 93, and make it level with the oxide layer 82. In one embodiment of the present invention, planarization is accomplished by the technique of CMP. CMP serves to substantially smooth the top surface of the hard mask layer 93 and oxide layer 82. The planarization process used in Step 22 serves to level the hard mask layer such that the hard mask layer is no longer atop oxide layer 82, and is only present in trench 92.

Figure 6:
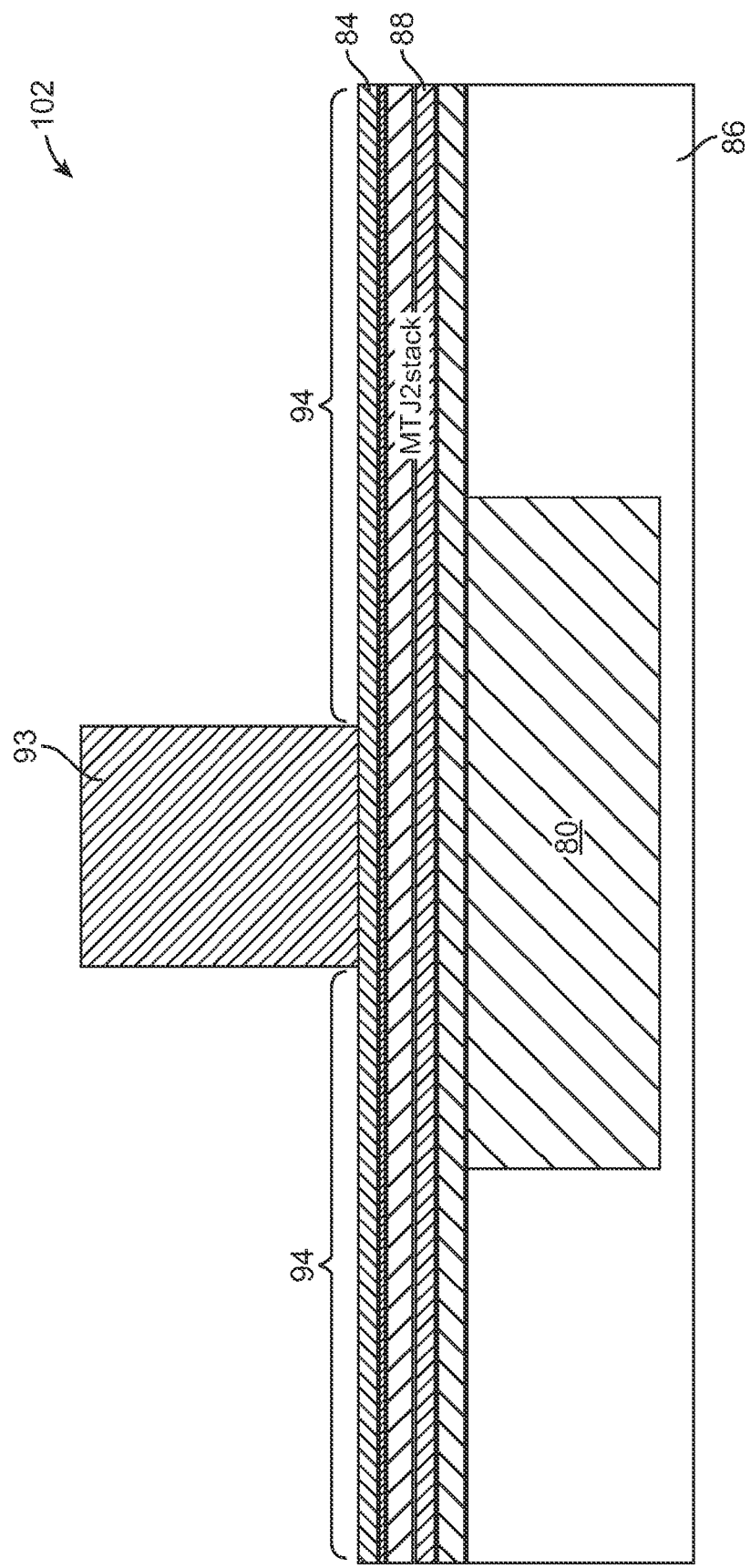
FIG. 6 shows a cross sectional view of memory cell 102 after Step 23 is completed.

FIG. 6 shows a cross sectional view of memory cell 102 after Step 23 (of FIG. 1) is completed. Memory cell 102 is shown to include CMOS wafer 86, conductive layer 80, MTJ stack 88, tantalum layer 84, uncovered Ta/MTJ stack layer 94, and hard mask layer 93. Blanket oxide etching is used to remove the oxide layer 82 to form an uncovered Ta/MTJ stack layer 94 thereby exposing the tantalum layer 84 where the layer oxide 82 resided. Uncovered Ta/MTJ stack layer 94 is shown to be the topmost layer of memory cell 102, except where hard mask layer 93 sits atop layer 94, in substantially the center of memory cell 102.

At Step 23, memory cell 102 undergoes a blanket oxide etching, removing the oxide layer 82, while leaving the hard mask layer 93. In one embodiment of the present invention, gas CF4 is used to remove the oxide 82. CF4 does not substantially etch the Cu. Cu seed layer that is underneath of oxide can be etched with CH3OH or CO/NH3. The Ta on top of the MTJ has to be etched with CF4 again and CH3OH or CO/NH3 chemistry has to be used for the rest of the MTJ layers. Despite different gas requirements for etching these different layers, the layers can all be etched generally in one chamber or two etching chambers. After etching, hard mask layer 93 sits atop layer 84 in substantially the center of memory cell 102. In an exemplary embodiment of the present invention, the hard mask layer 93 is made of copper, and is approximately 650 Angstroms wide and 1500 Angstroms tall.

Figure 7:
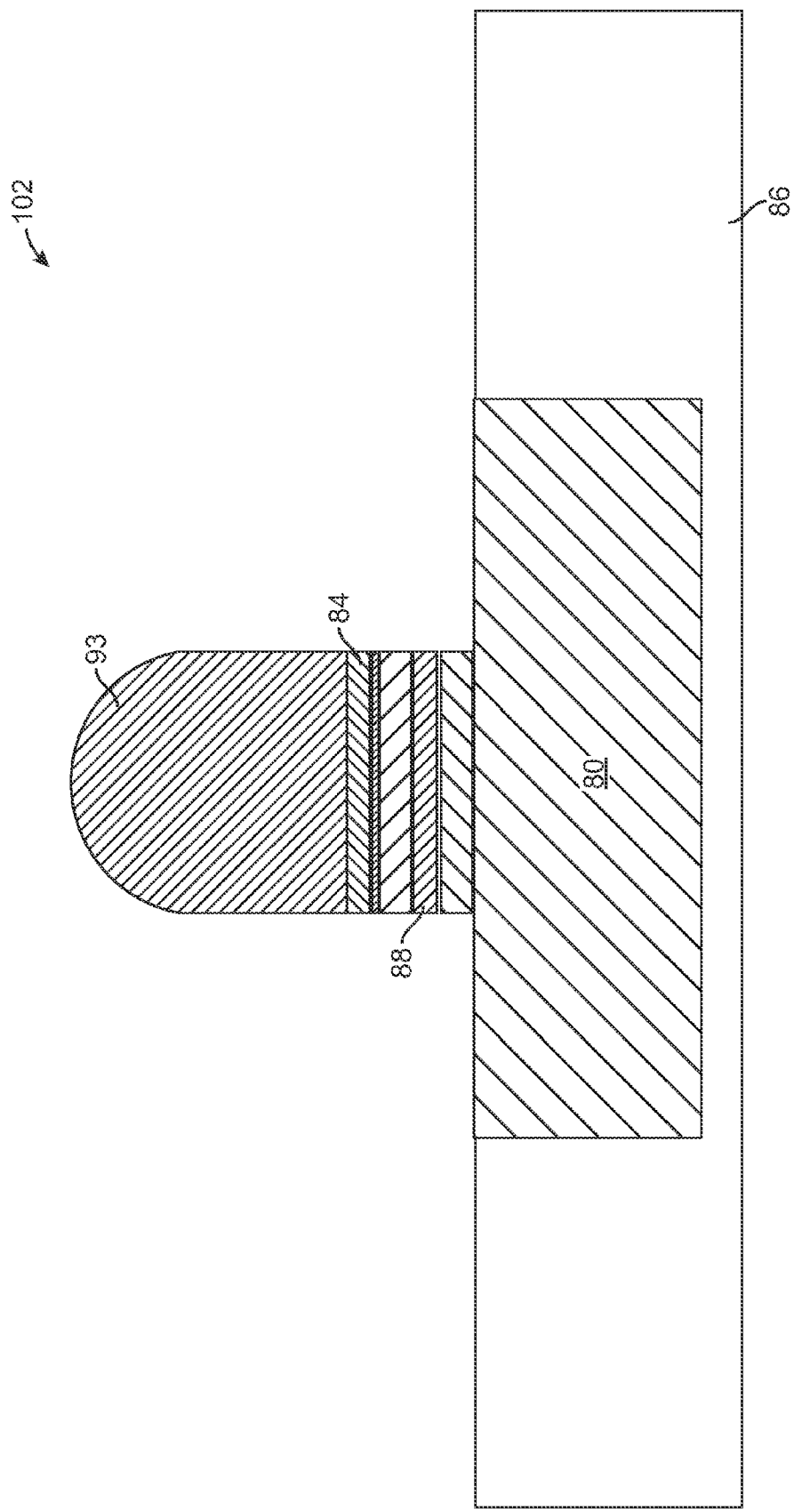
FIG. 7 shows a cross sectional view of memory cell 102 after Step 24 is completed.

FIG. 7 shows a cross sectional view of memory cell 102 after Step 24 (of FIG. 1) is completed. Memory cell 102 is shown to include CMOS wafer 86, conductive layer 80, MTJ stack 88, tantalum layer 84, and the hard mask layer 93.

At Step 24, the MTJ stack 88 undergoes etching to remove undesired areas of MTJ stack 88, which are adjacent of hard mask layer 93. At Step 24, the uncovered Ta/MTJ stack layer 94 is removed by etching. More specifically, an etching process is performed on the structure of FIG. 6 to remove the layers 84 and 88 everywhere except that which is covered by the hard mask 93. This process causes the shape of the hard mask 93 (in FIG. 7) to appear more as a dome-shaped structure on top due to erosion of sharp Cu edges during oxide etch, thereof than the more rectangular (or flat-top) structure of FIG. 6. In an exemplary embodiment MTJ stack 88 is approximately 300 Angstroms tall and hard mask layer 93 is approximately 1000 Angstroms tall.

Figure 8:
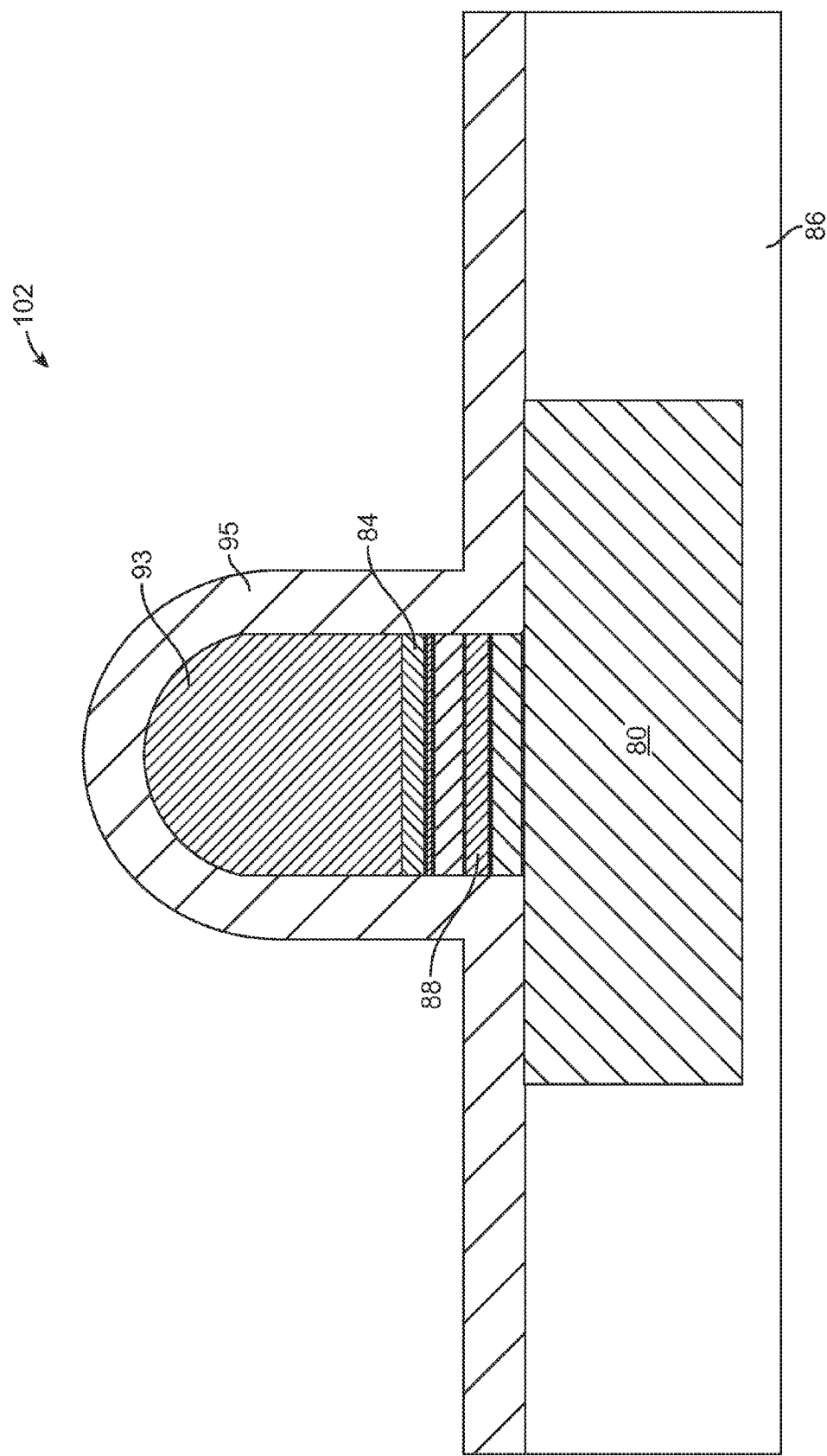
FIG. 8 shows a cross sectional view of memory cell 102 after Step 25 is completed.

FIG. 8 shows a cross sectional view of memory cell 102 after Step 28 (of FIG. 1) is completed. Memory cell 102 is shown to include CMOS wafer 86, conductive layer 80, MTJ stack 88, tantalum layer 84, hard mask layer 93, and shielding layer 95.

At Step 28, a shielding layer 95 is deposited atop memory cell 102 of FIG. 7 thereby covering the top of the conductive layer 80, CMOS wafer 86 and hard mask 93 as well as the adjacent sides of the hard mask 93 and the adjacent sides of the MTJ stack 88 and tantalum layer 84. Due to the dome-shaped structure of the layer 93, the layer 95 is also dome-shaped following the shape of its under-layer (hard mask layer 93). In an exemplary embodiment of the present invention, the shielding layer 95 is made of silicon-nitride ($Si_3N_4$).

In another exemplary embodiment of the present invention, the shielding layer 95 is approximately 1500 Angstroms thick.

Figure 9:
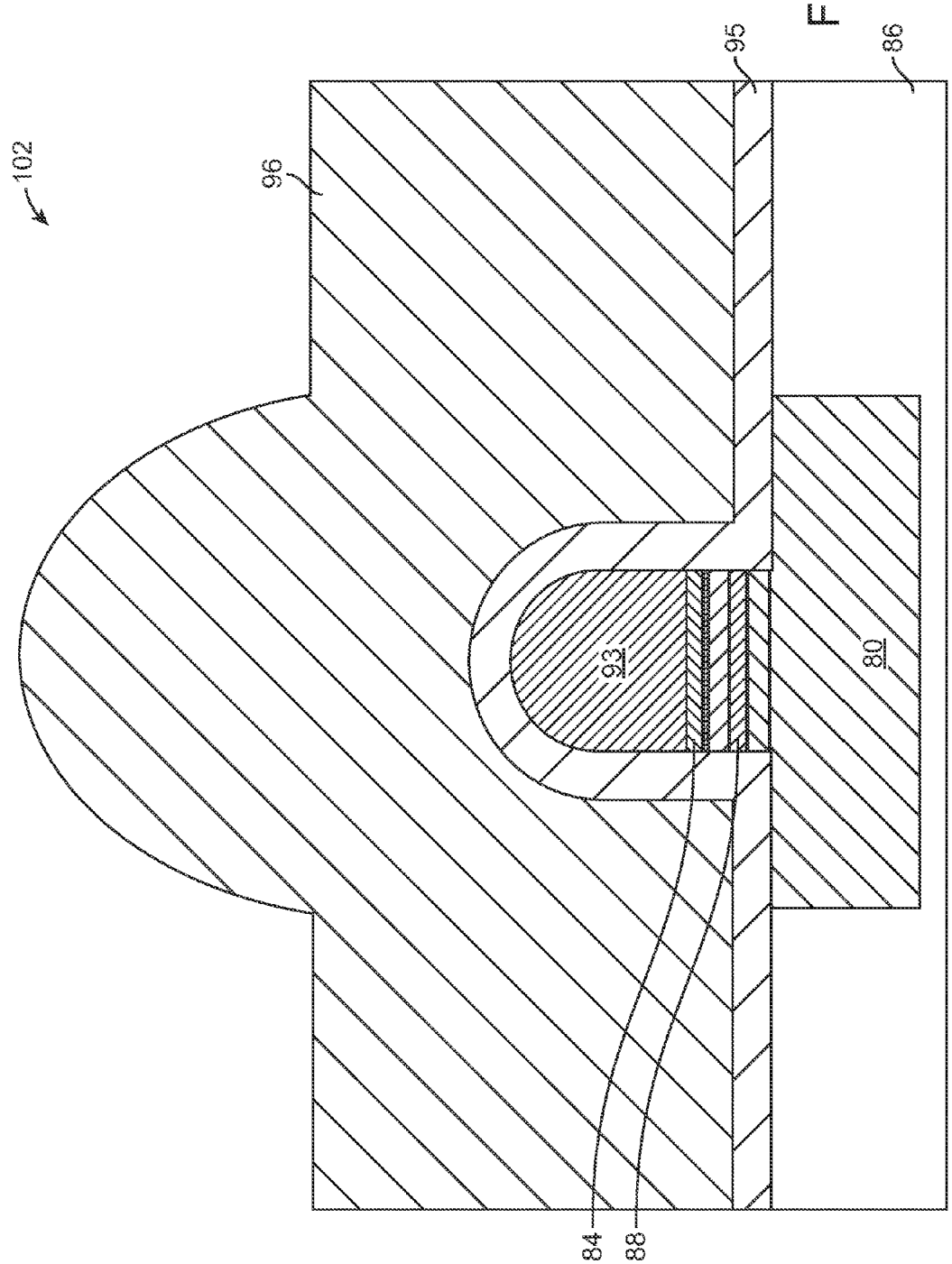
FIG. 9 shows a cross sectional view of memory cell 102 after Step 26 is completed

FIG. 9 shows a cross sectional view of memory cell 102 after Step 30 (of FIG. 1) is completed. Memory cell 102 is shown to include CMOS wafer 86, conductive layer 80, MTJ stack 88, tantalum layer 84, shielding layer 95 in which the shielding layer 95 is polished with CMP to render it flat. CMP is performed in such a way so as to cause removal of 1400 Angstrom (A) on top of the MTJ but only 500 A in the flat region of the shielding Nitride. This indicates that the thickness of the shielding silicon nitride on top of MTJ is approximately 100 A while in the flat areas, it is around 1000 A.

At Step 32, second oxide layer 96 is deposited on top of the shielding layer 95. The second oxide layer 96 is deposited atop memory cell 102, substantially covering the shielding layer 95 after CMP. Since the shielding layer 95, after CMP, is flat the second oxide layer 96 is also flat. In an exemplary embodiment of the present invention, Step 32 is performed using a low temperature, silicon-dioxide deposition. In another exemplary embodiment of the present invention, the second oxide layer 96 is approximately 3000 Angstroms thick. In some embodiments of the present invention, the second oxide layer is made of silicon-dioxide.

Figure 10:
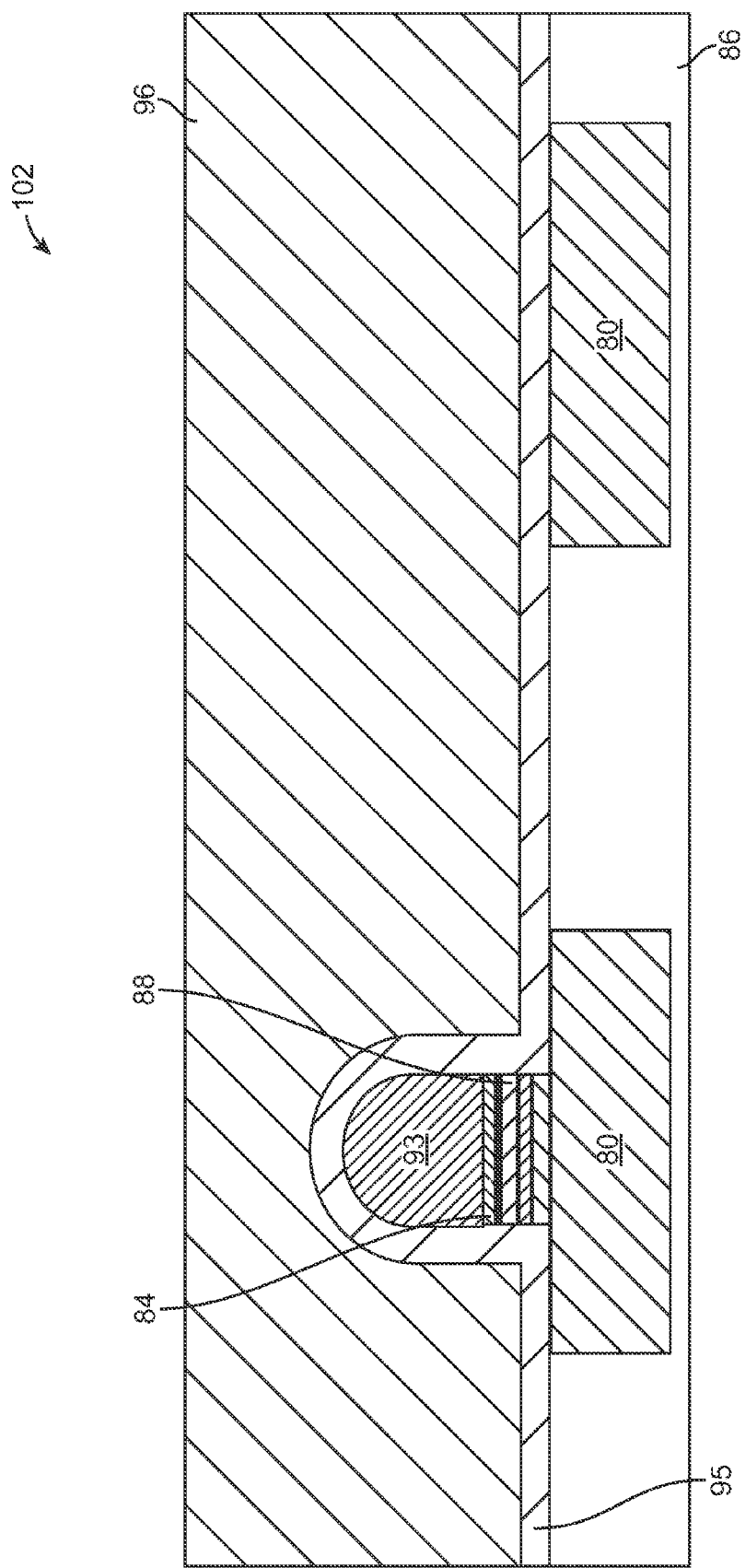
FIG. 10 shows a cross sectional view of memory cell 102 after Step 27 is completed.

FIG. 10 shows a cross sectional view of memory cell 102 after Step 32 (of FIG. 1) is completed. FIG. 10-18 show a more distant cross sectional view of memory cell 102 to further include the neighboring area of memory cell 102. Memory cell 102 is shown to include CMOS wafer 86, conductive layer 80, MTJ stack 88, tantalum layer 84, hard mask layer 93, shielding layer 95, and second oxide layer 96.

Figure 11:
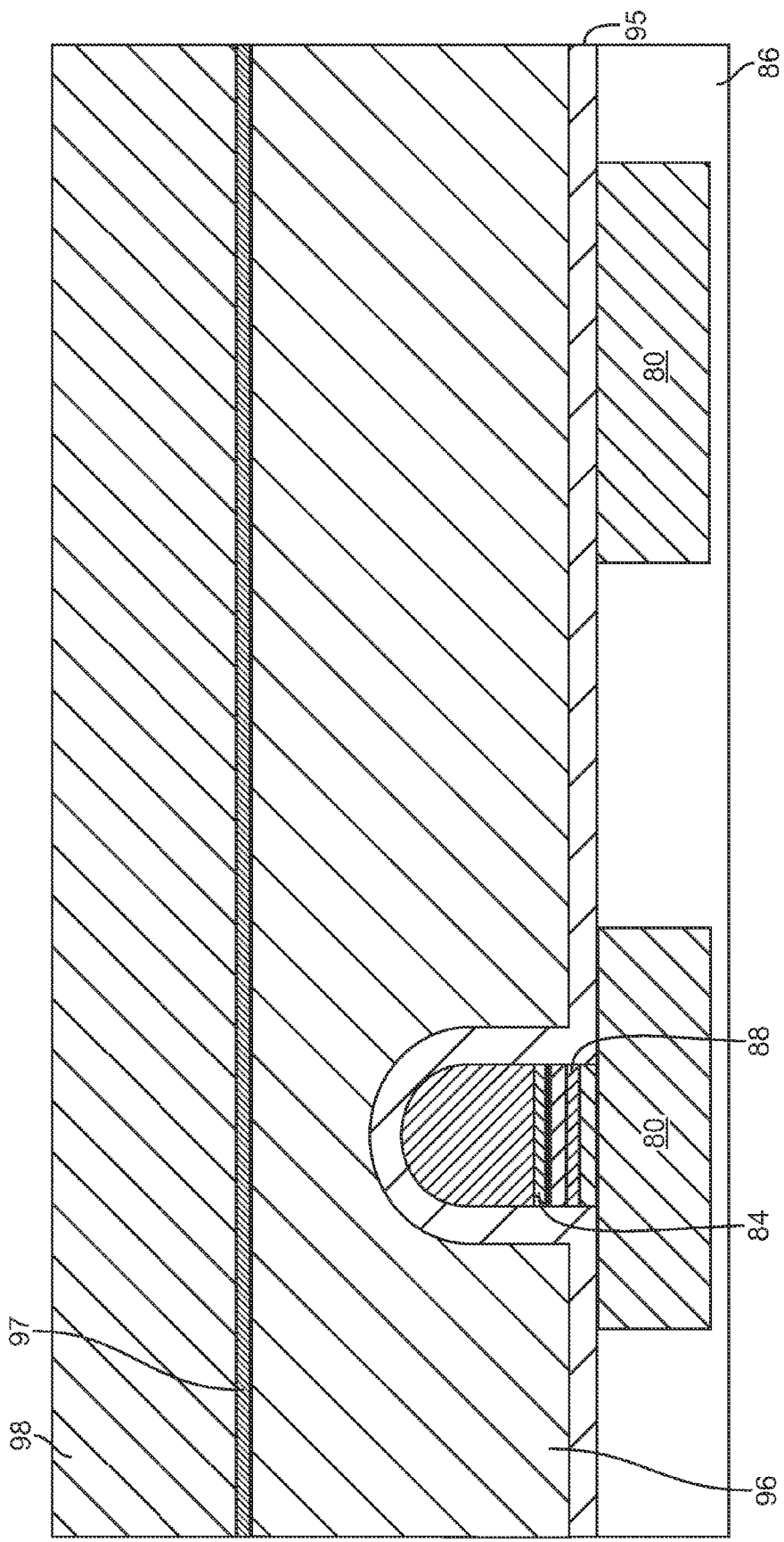
FIG. 11 shows a cross sectional view of memory cell 102 after Step 28 is completed.

FIG. 11 shows a cross sectional view of memory cell 102 after Step 34 (of FIG. 1) is completed. Memory cell 102 is shown to include CMOS wafer 86, conductive layer 80, MTJ stack 88, tantalum layer 84, hard mask layer 93, shielding layer 95 (the layer 95 having been CMPed), second oxide layer 96, second shielding layer 97, and third oxide layer 98.

At Step 34, a second shielding layer 97 is deposited, followed by the deposition of a third oxide layer 98. The second shielding layer 97 is deposited on top of the second oxide layer 96 (of FIG. 10). Next, the third oxide layer 98 is formed (or deposited) on top of the layer 97. In an exemplary embodiment of the present invention, the third oxide layer 98 is approximately 1750 Angstroms thick. In another exemplary embodiment of the present invention, the second shielding layer 97 is made of silicon-nitride ($Si_3N_4$). The second shielding layer 97 is an indicator that the first oxide is etched.

Figure 12A:
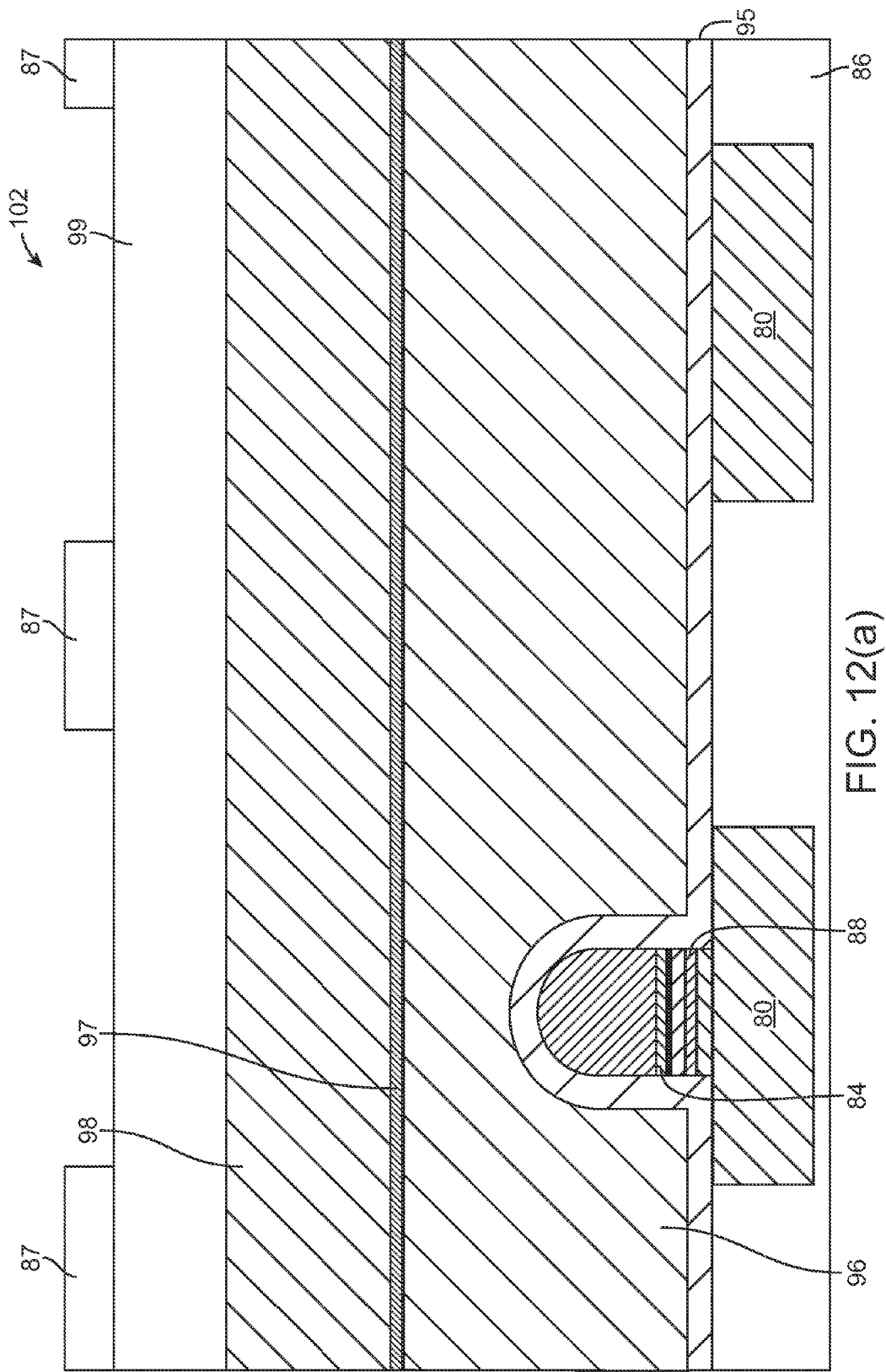
FIG. 12(a) shows a cross sectional view of memory cell 102 after Step 29 is completed.
Figure 12B:
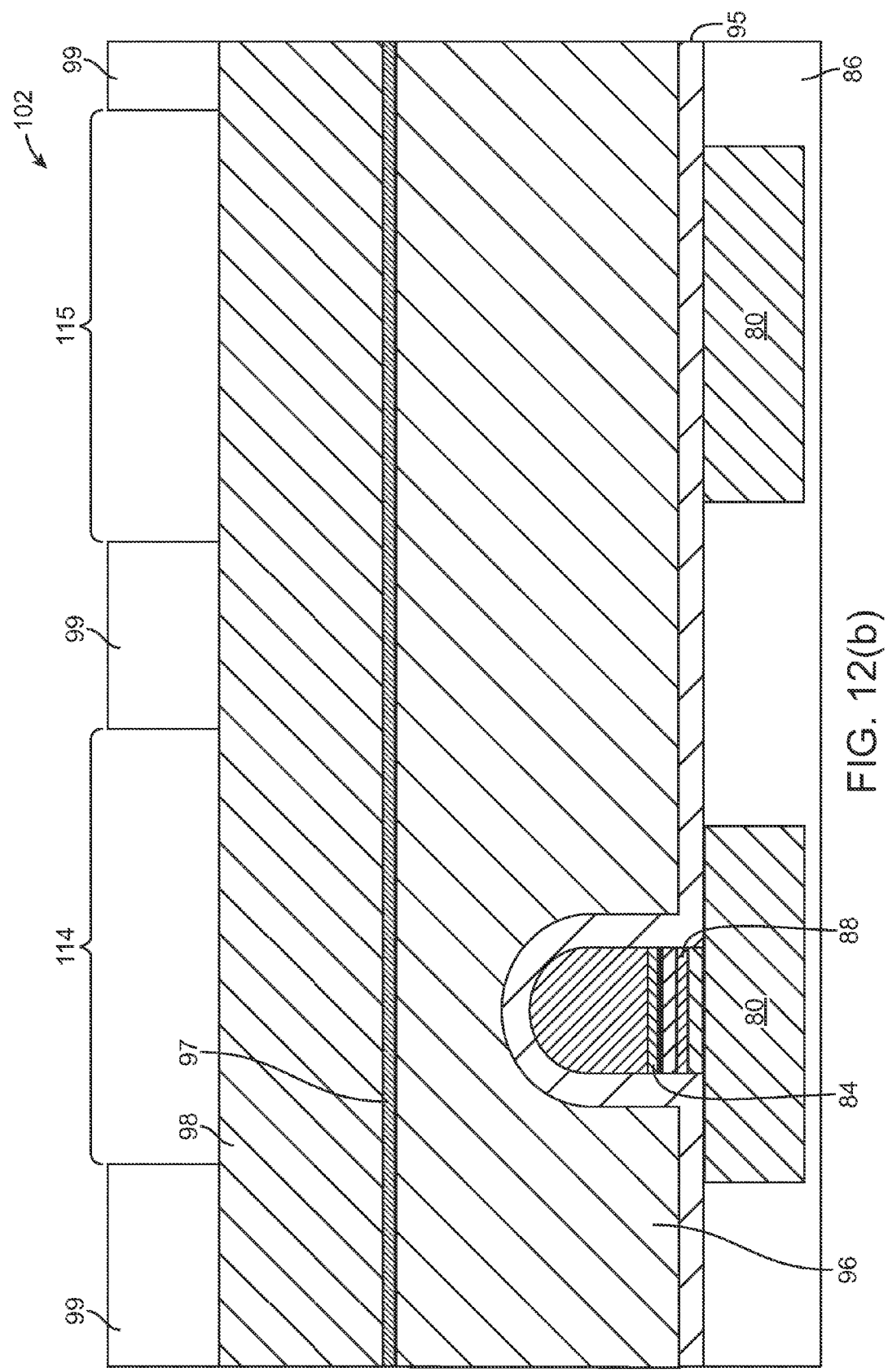
FIG. 12(b) shows a cross sectional view of memory cell 102 after Step 30 is completed.
Figure 12C:
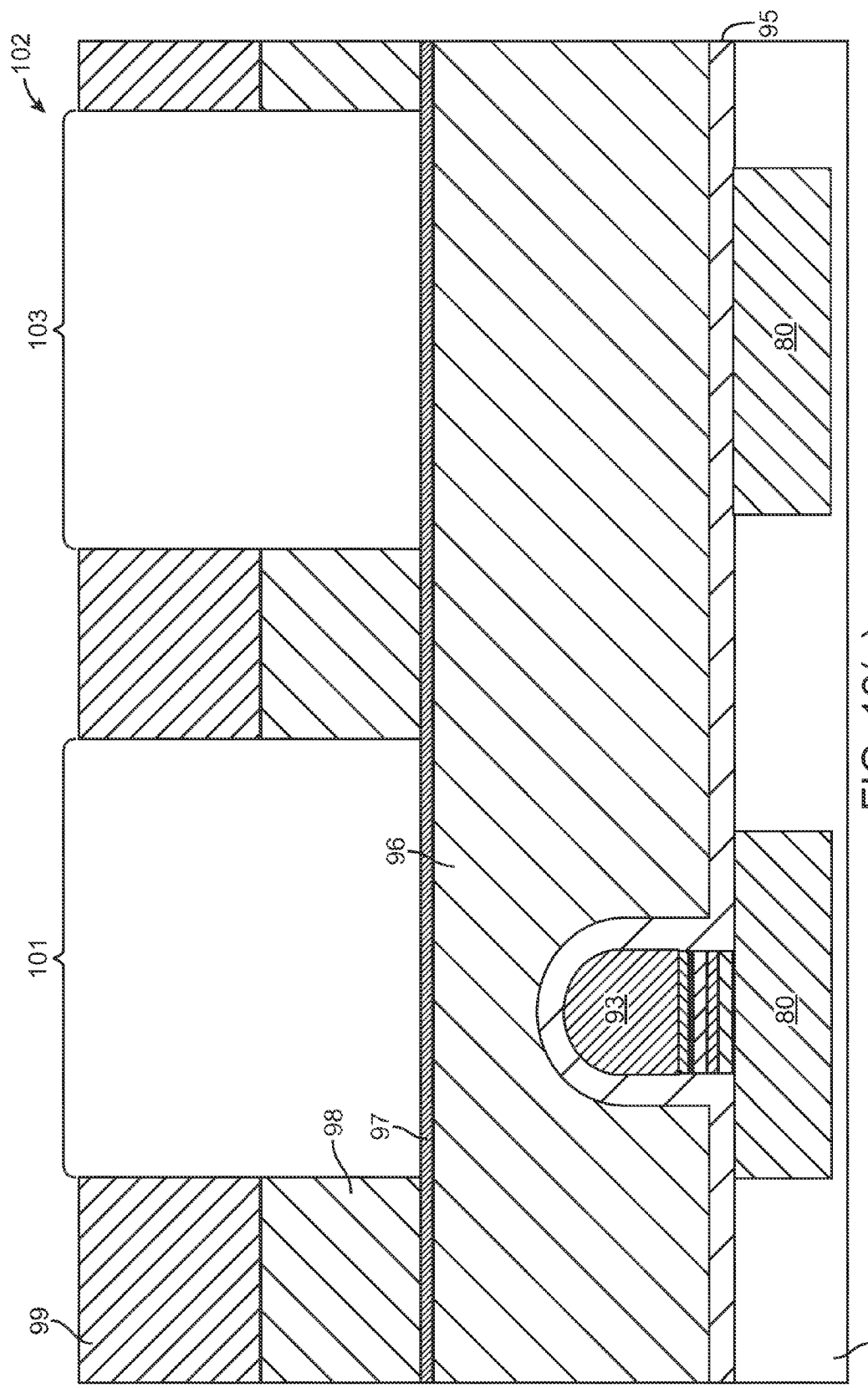
FIG. 12(c) shows a cross sectional view of memory cell 102 after Step 31.

FIG. 12(*a*) shows a cross sectional view of memory cell 102 after step 36 (of FIG. 1) is completed. Memory cell 102 is shown to include CMOS wafer 86, conductive layer 80, MTJ stack 88, tantalum layer 84, shielding layer 95, second oxide layer 96, second shielding layer 97, and third oxide layer 98, second photo-resist layer 99, and mask layer 87.

At step 36, second photo-resist layer 99 is deposited atop substantially the entire surface of third oxide layer 98. The second photo-resist layer 99 is then selectively exposed. That is, using one selective exposure technique.

Accordingly, the second photo-resist layer 99 is selectively exposed with the exposed area defined by the mask layer 87. Exposure is done using known techniques, such as using ASML 193 exposure tool. This tool utilizes 193 nm ultra violet (UV) to expose the photo resist. This selective exposure defines which areas of the second photo-resist layer 99 are removed.

FIG. 12(*b*) shows a cross sectional view of memory cell 102 after Step 37 (of FIG. 1) is completed. Memory cell 102 is shown to include CMOS wafer 86, conductive layer 80, MTJ stack 88, tantalum layer 84, shielding layer 95, second oxide layer 96, second shielding layer 97, and third oxide layer 98, second photo-resist layer 99, partial trench 114, and partial trench 115.

At Step 37, a portion of the second photo-resist layer 99 is removed to form partial trench 114 and partial trench 115. The partial trench 114 and partial trench 115 are formed down through the second photo-resist layer 99. Partial trenches 114 and 115, are formed by removing portions of the second photo-resist layer 99, and are formed generally centered over the conductive layer 80. Further, partial trenches 114 and 115 are formed such that the top of third oxide layer 98 is exposed, and layer 98 forms the bottom of partial trenches 114 and 115.

FIG. 12(*c*) shows a cross sectional view of memory cell 102 after Step 37 (of FIG. 1) is completed. Memory cell 102 is shown to include CMOS wafer 86, conductive layer 80, MTJ stack 88, tantalum layer 84, shielding layer 95, second oxide layer 96, second shielding layer 97, third oxide layer 98, oxide trench 101, and oxide trench 103.

At Step 37, the third oxide layer 98 is etched, using the partial trenches 114 and 115 to access the third oxide layer 98, to form oxide trenches 101 and 103, as shown in FIG. 12. In some embodiments, etching is performed using tetra-fluoro-carbon ($CF_4$) (or tetrafluoromethane) to form oxide trenches 101 and 103, which are formed from the second photo-resist layer 99 down through the third oxide layer 98, and stopping at the second shielding layer 97. In some embodiments, RIE is used when performing the etching step. Etching of the third oxide layer 98 stops at the second shielding layer 97 due to the characteristics of the second shielding layer 97. In an exemplary embodiment of the present invention, the second shielding layer 97 is made of silicon-nitride ($Si_3N_4$).

Figure 13:
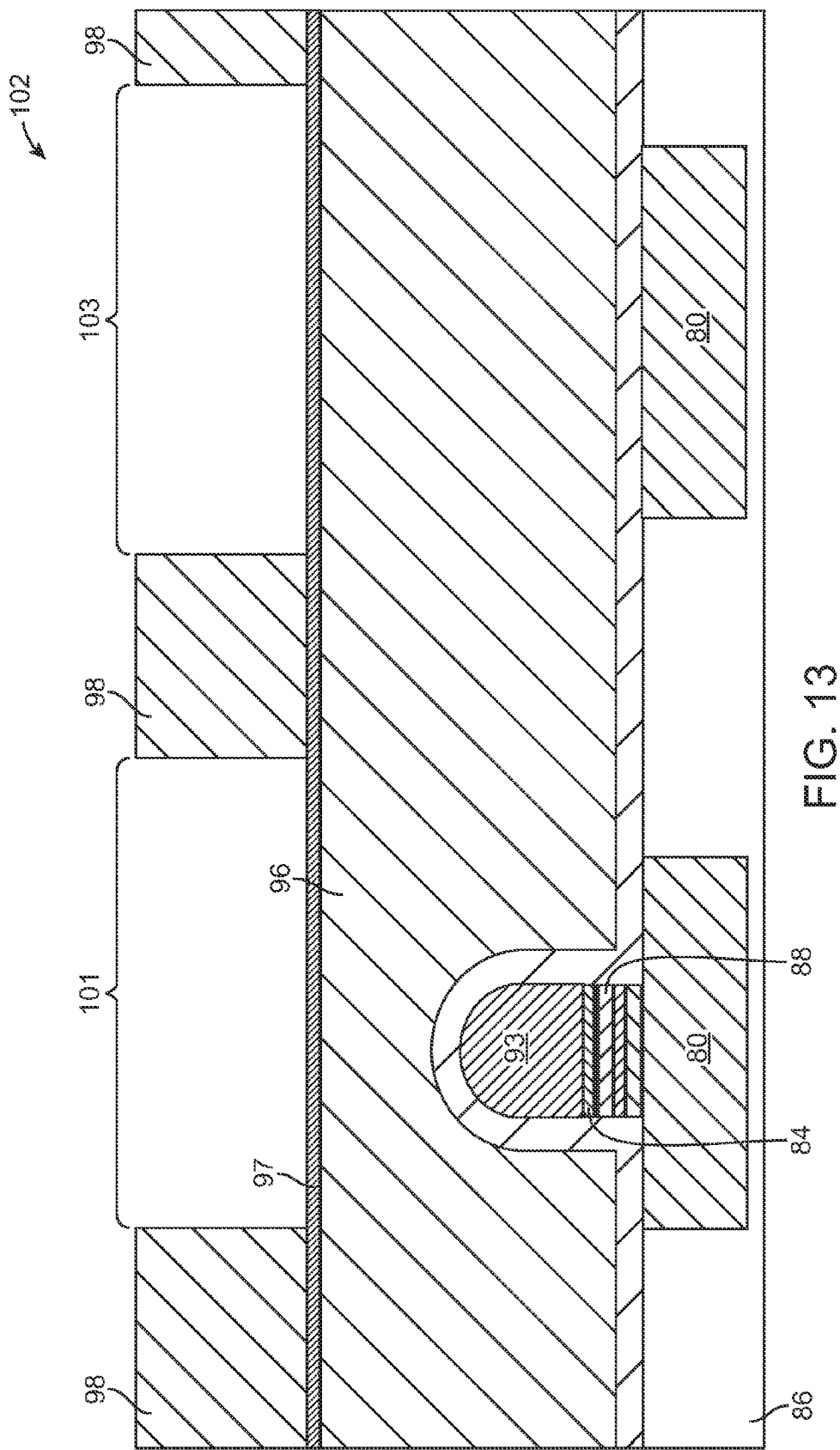
FIG. 13 shows a cross sectional view of memory cell 102 after Step 32 is completed.

FIG. 13 shows a cross sectional view of memory cell 102 after Step 37 (of FIG. 1) is completed. Memory cell 102 is shown to include CMOS wafer 86, conductive layer 80, MTJ stack 88, tantalum layer 84, shielding layer 95, second oxide layer 96, second shielding layer 97, third oxide layer 98, oxide trench 101, and oxide trench 103.

At Step 37, the memory cell 102 is ashed to remove the remaining second photo-resist layer 99. In one embodiment of the present invention plasma ashing is used to remove layer 99. Ashing is the exposure of the photo resist to Oxygen plasma. During this plasma treatment, the ionic O burns the organic photo resist.

FIG. 14(*a*) shows a cross sectional view of memory cell 102 after Step 38 (of FIG. 1) is completed. Memory cell 102 is shown to include CMOS wafer 86, conductive layer 80, MTJ stack 88, tantalum layer 84, hard mask layer 93, shielding layer 95, second oxide layer 96, second shielding layer 97, third oxide layer 98, third photo-resist layer 105, and mask layer 85.

At Step 38, third photo-resist layer 105 is deposited atop substantially the entire surface of memory cell 102. Stated differently, the remainder of the third oxide layer 98 (of FIG. 13) and the exposed portion of the second shielding layer 97 (of FIG. 13) and the oxide trenches 101 and 103 (of FIG. 13) are covered with third photo-resist layer 105. The third photo-resist layer 105 is formed above the layers 98 and 97 and the top of the oxide trenches 101 and 103 to not only cover the tops thereof but to extend beyond the tops up to a suitable thickness there above. The third photo resist layer 105 is then exposed selectively to UV light by an exposing machine known in the semiconductor industry as stepper machines. Mask layer 85, in some embodiments, is made of a very flat glass with via patterns formed on it with chromium (Cr). Generally, the via patterns on this mask is 4 to 5 times larger than the actual via's on the silicon wafer. The exposure machine creates the picture of this mask on the wafer, with correct dimensions and properly aligned with respect to the previous layers of the wafer.

Accordingly, the third photo-resist layer 105 is selectively exposed with the exposed area defined by the third photo-resist layer 105. Exposure is done using known techniques, such as using ASM 193 stepper tool. This tool utilizes 193 nm UV to expose the photo-resist. This selective exposure defines which areas of the third photo-resist layer 105 are removed. Exposing the third photo-resist 105 at selective areas defined by the mask layer 85 forms the partial trench 112 (of FIG. 14(a)).

Figure 14A:
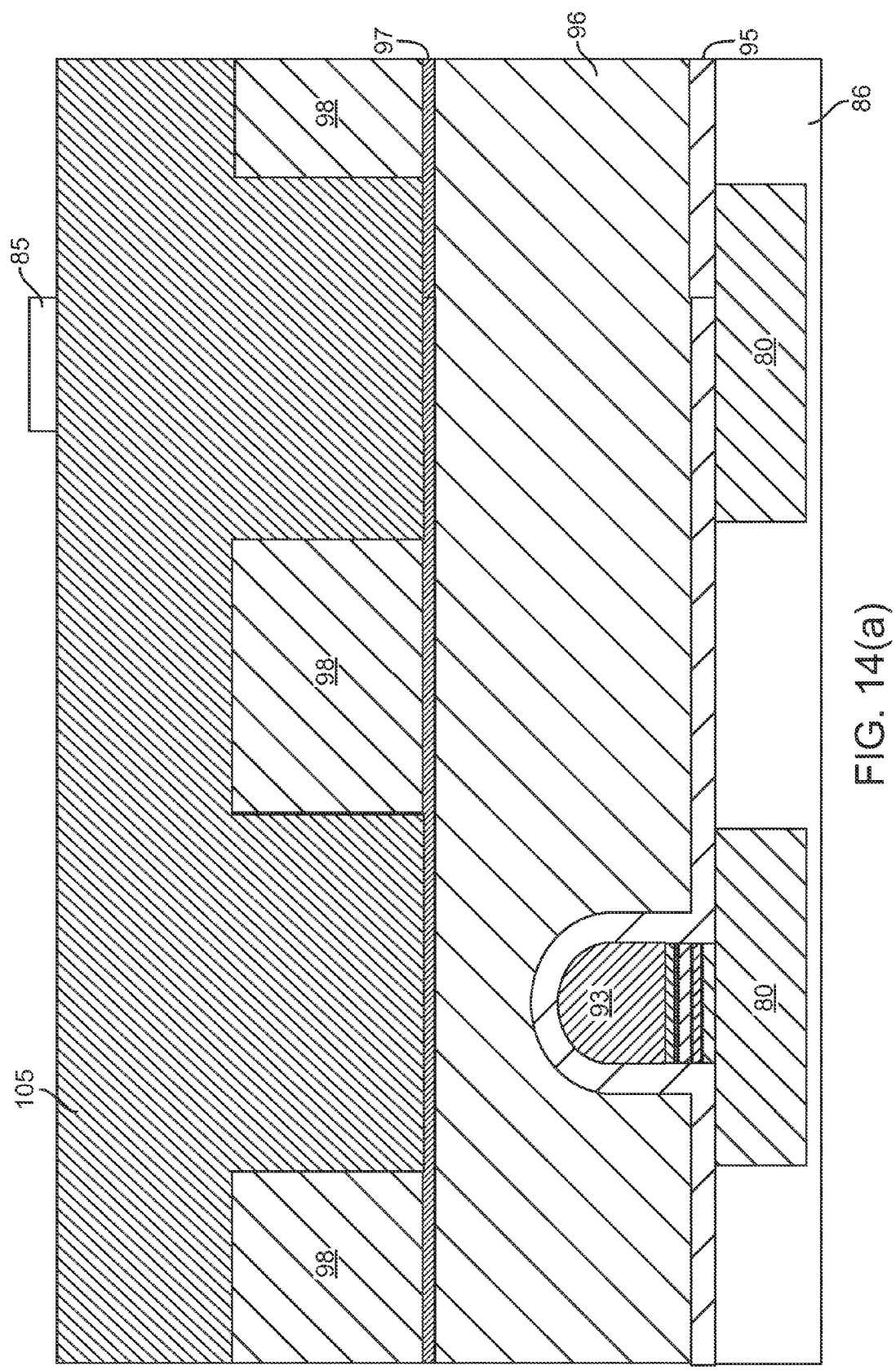
FIG. 14(a) shows a cross sectional view of memory cell 102 after Step 33 is completed.
Figure 14B:
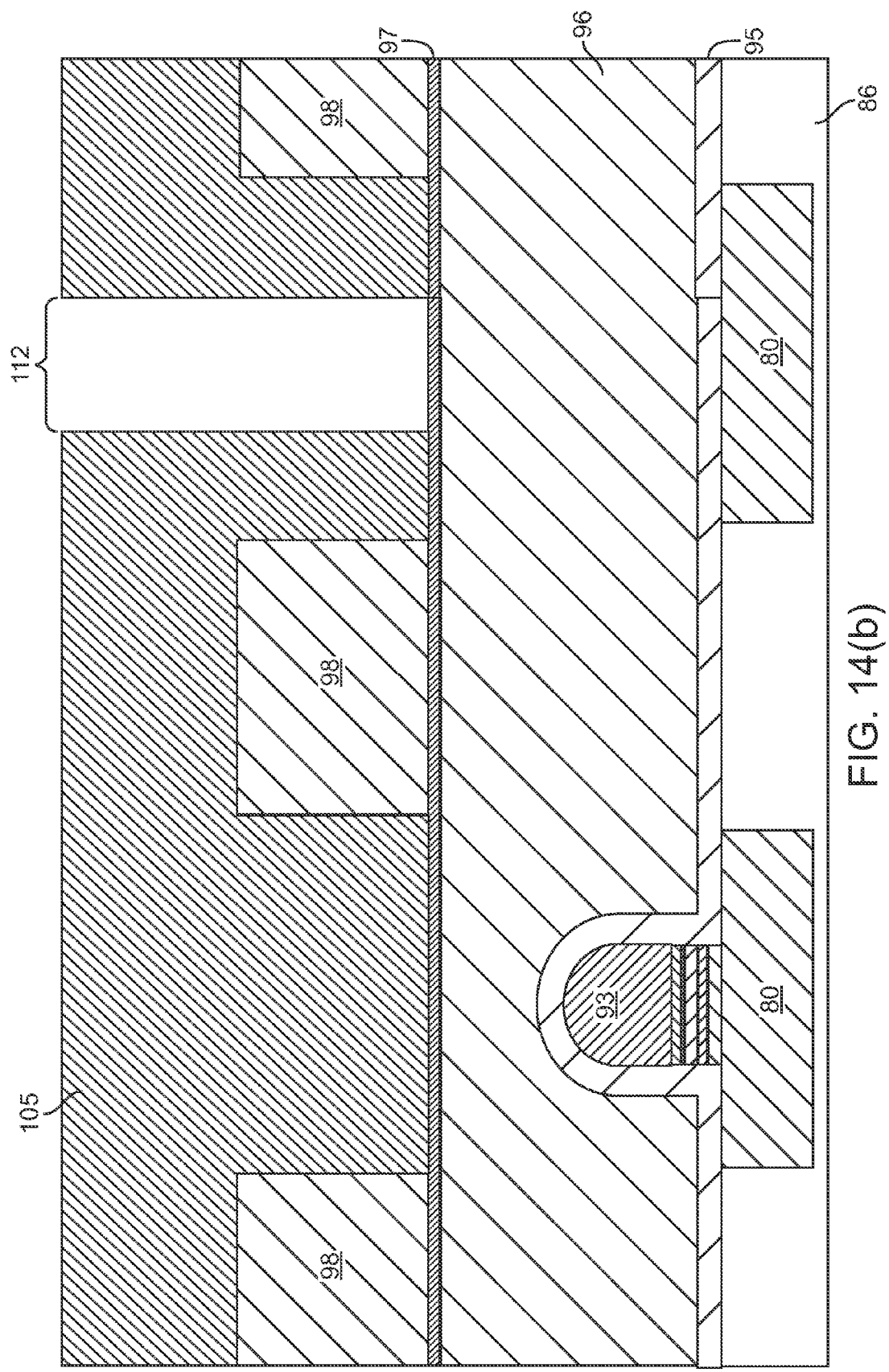
FIG. 14(b) shows a cross sectional view of memory cell 102 after Step 34 is completed.

FIG. 14(b) shows a cross sectional view of memory cell 102 after Step 38 (of FIG. 1) is completed. Memory cell 102 is shown to include CMOS wafer 86, conductive layer 80, MTJ stack 88, tantalum layer 84, hard mask layer 93, shielding layer 95, second oxide layer 96, second shielding layer 97, third oxide layer 98, third photo-resist layer 105, and partial trench 112.

At Step 38, the partial trench 112 is formed down through the third photo-resist layer 105, and stopping at the top of second shielding layer 97. Partial trench 112, is formed by removing portions of third photo-resist layer 105, and is formed generally centered over the conductive layer 80 onto which the MTJ stack is not disposed. Further, partial trench 112 is formed such that the top of the second shielding layer 97 is exposed, and layer 97 forms the bottom of partial trench 112.

Figure 14C:
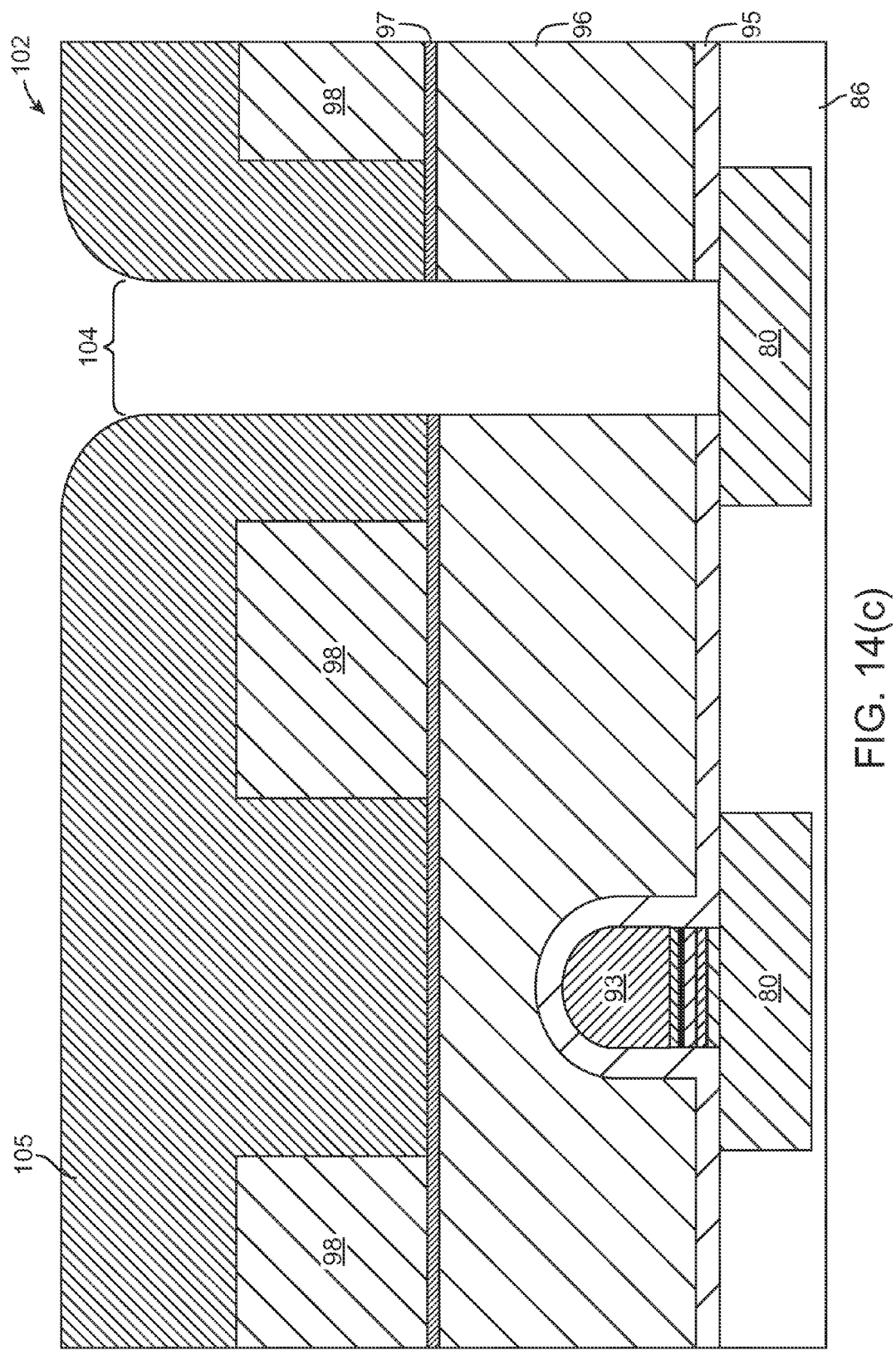
FIG. 14(c) shows a cross sectional view of memory cell 102 after Step 35 is completed.

FIG. 14(c) shows a cross sectional view of memory cell 102 after Step 38 (of FIG. 1) is completed. Memory cell 102 is shown to include CMOS wafer 86, conductive layer 80, MTJ stack 88, tantalum layer 84, hard mask layer 93, shielding layer 95, second oxide layer 96, second shielding layer 97, third oxide layer 98, third photo-resist layer 105, and via trench 104.

Figure 15:
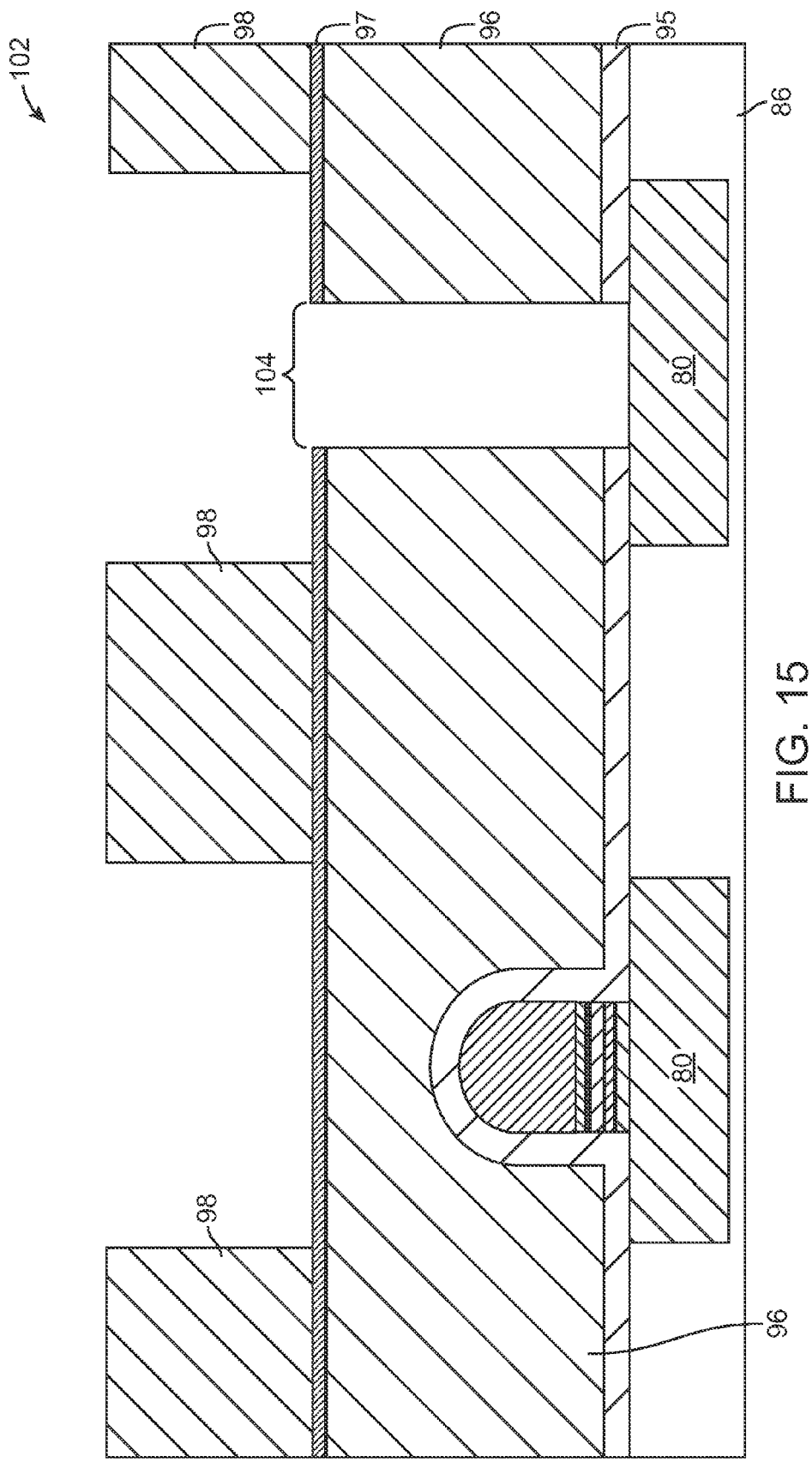
FIG. 15 shows a cross sectional view of memory cell 102 after Step 36 is completed.

At Step 38, the trench is formed by etching the second shielding layer 97, second oxide layer 96, and shielding layer 95 only in an area defined by the width of via trench 104, substantially in the middle of the conductive layer 80 but only affecting layer 80 in areas where no MTJ is formed, by etching from the top of the second shielding layer 97 down through to the shielding layer 95, exposing the top of the layer 80. The etching process of Step 38 stops at the top of the conductive layer 80 due to the characteristics of the material forming the layer 80. In some embodiments, reactive ion etching (RIE) is used when performing the etching step FIG. 15 shows a cross sectional view of memory cell 102 after Step 40 (of FIG. 1) is completed. Memory cell 102 is shown to include CMOS wafer 86, conductive layer 80, MTJ stack 88, tantalum layer 84, hard mask layer 93, shielding layer 95, second oxide layer 96, second shielding layer 97, third oxide layer 98, and via trench 104.

At Step 40, the third photo-resist layer 105, is exposed with MTJ-Via mask to remove the remaining layer 105. In an exemplary embodiment of the present invention, plasma ashing is used to remove the remaining layer 105. After removal of third photo-resist layer 105, the top of memory cell 102 is shown to include layer 98 and layer 97, except for via trench 104 which exposes conductive layer 80.

Figure 16A:
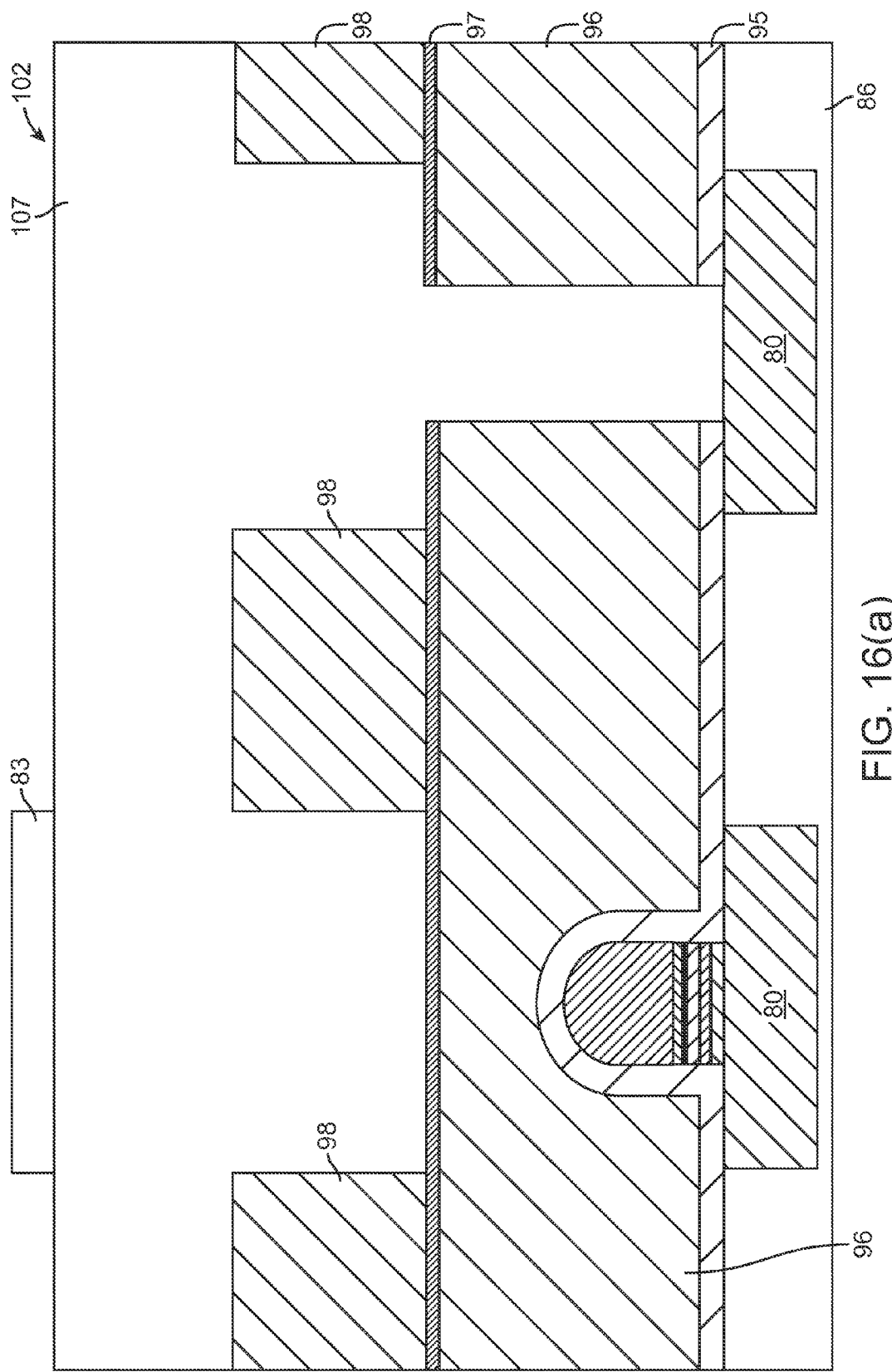
FIG. 16(a) shows a cross sectional view of memory cell 102 after Step 37 is completed.

FIG. 16(a) shows a cross sectional view of memory cell 102 after Step 40 (of FIG. 1) is completed. Memory cell 102 is shown to include CMOS wafer 86, conductive layer 80, MTJ stack 88, tantalum layer 84, hard mask layer 93, shielding layer 95, second oxide layer 96, second shielding layer 97, third hard layer 98, fourth photo-resist layer 107, and mask layer 83.

At Step 40, a fourth photo-resist layer 107 is deposited atop substantially the layers 98, 97 (of FIG. 15), as well as the exposed portion of the conductive layer 80 (of FIG. 15). The fourth photo-resist layer 107 is then covered with a mask in areas that are to be selectively exposed. That is, using one selective exposure technique, a mask layer 83 is to expose the fourth photo-resist layer 107 in areas that are to be removed.

Accordingly, the fourth photo-resist layer 107 is selectively exposed with the exposed area defined by the mask layer 83. Exposure is done using known techniques, such as using ASM 193 stepper tool. This tool utilizes 193 nm UV to expose the photo-resist. This selective exposure defines which areas of the fourth photo-resist layer 107 are removed. Exposing the fourth photo-resist layer 107 at selective areas defined by the mask layer 83 forms the partial trench 113 (of FIG. 16(b)).

Figure 16B:
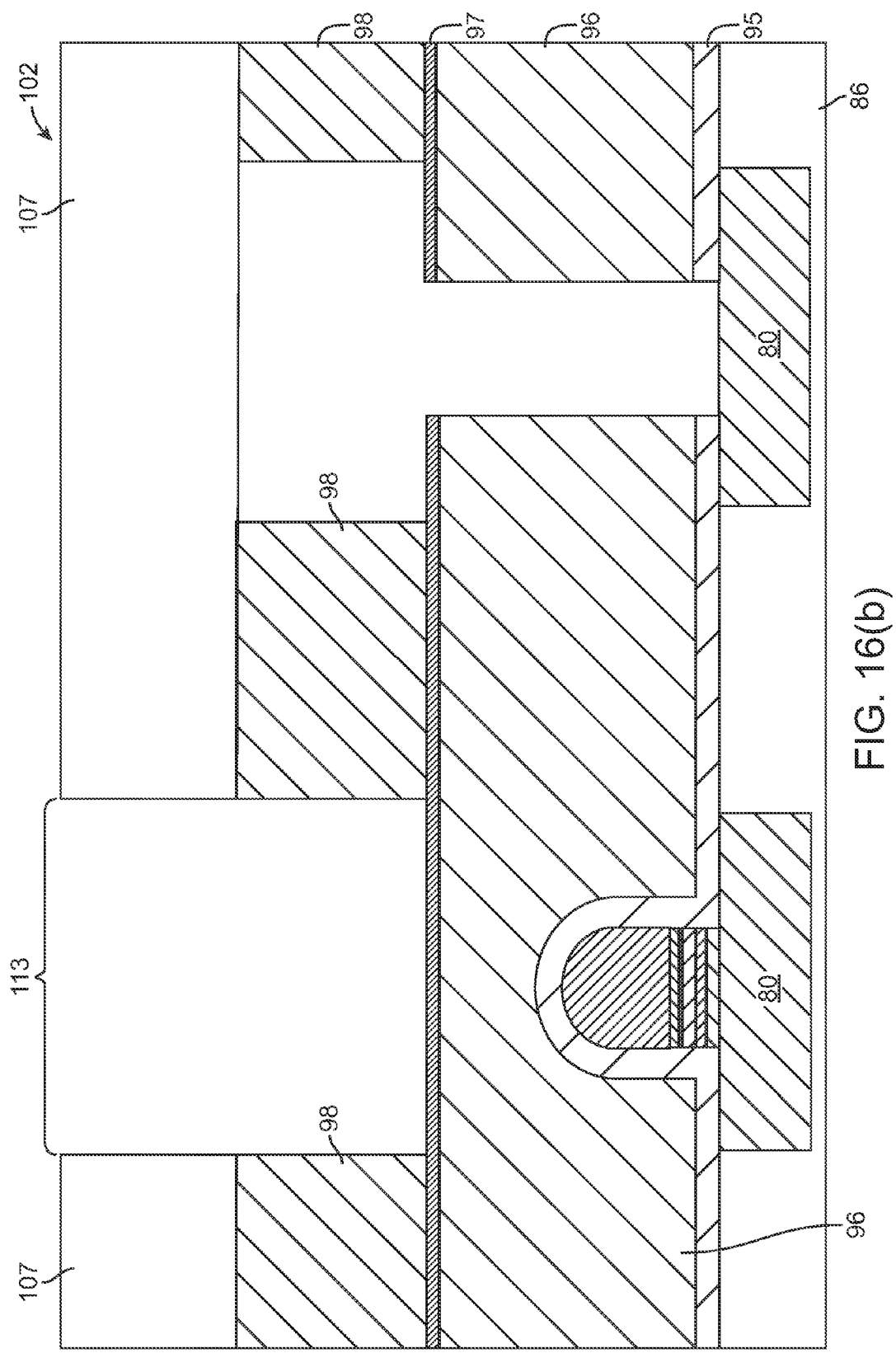
FIG. 16(b) shows a cross sectional view of memory cell 102 after Step 38 is completed.

FIG. 16(b) shows a cross sectional view of memory cell 102 after Step 40 (of FIG. 1) is completed. Memory cell 102 is shown to include CMOS wafer 86, conductive layer 80, MTJ stack 88, tantalum layer 84, hard mask layer 93, shielding layer 95, second oxide layer 96, second shielding layer 97, third hard layer 98, fourth photo-resist layer 107, and partial trench 113.

At Step 40, the partial trench 113 is formed down through the fourth photo-resist layer 107, and stopping at the top of second shielding layer 97. Partial trench 113, is formed by removing portions of the fourth photo-resist layer 107, and is formed generally centered over the conductive layer 80 onto which the MTJ stack is disposed. Further, partial trench 113 is formed such that the top of the second shielding layer 97 is exposed, and layer 97 forms the bottom of partial trench 113.

Figure 16C:
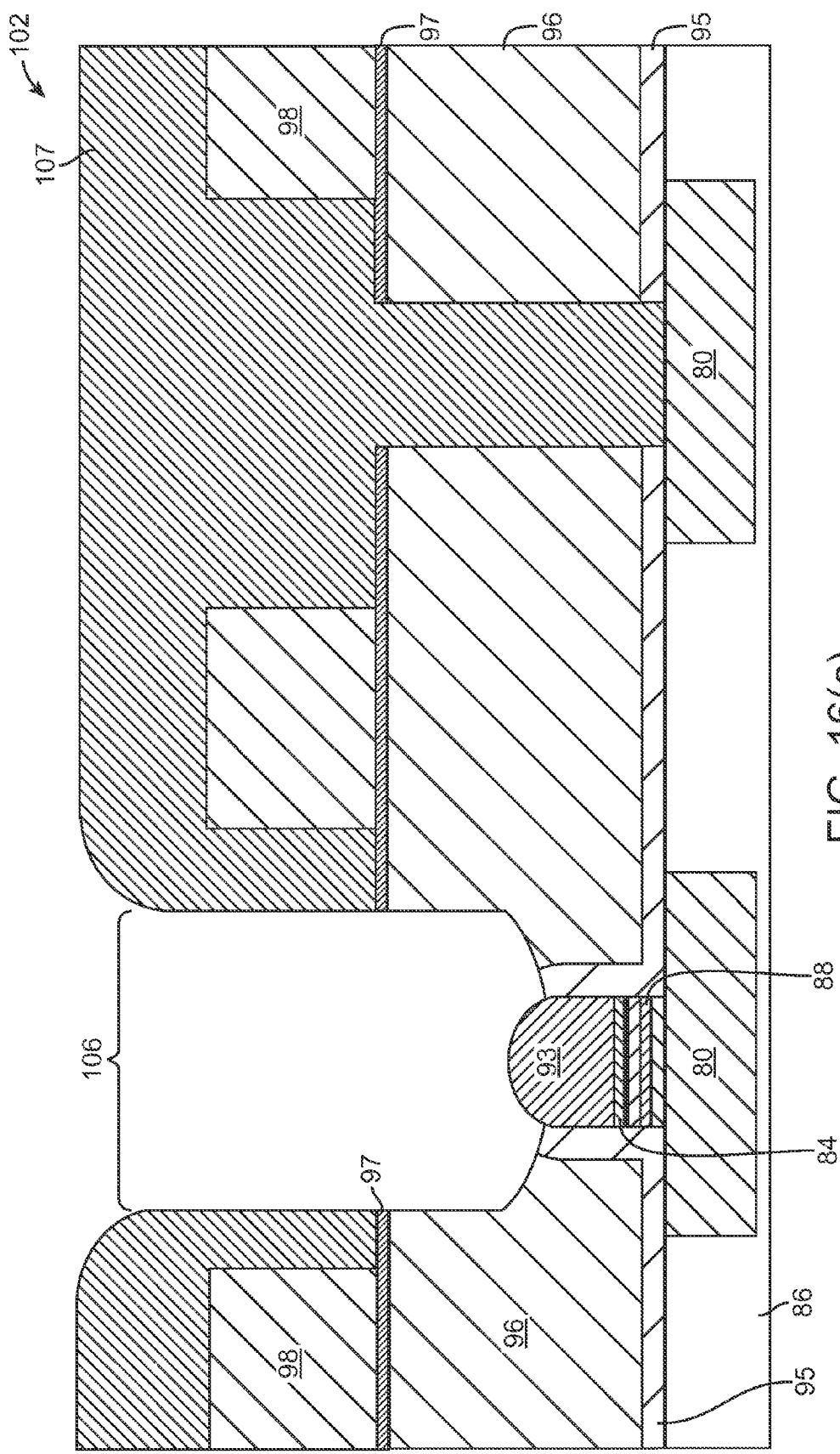
FIG. 16(c) shows a cross sectional view of memory cell 102 after Step 39 is completed.

FIG. 16(c) shows a cross sectional view of memory cell 102 after Step 40 (of FIG. 1) is completed. Memory cell 102 is shown to include CMOS wafer 86, conductive layer 80, MTJ stack 88, tantalum layer 84, hard mask layer 93, shielding layer 95, second oxide layer 96, second shielding layer 97, third hard layer 98, fourth photo-resist layer 107, and MTJ trench 106.

At Step 40, the second shielding layer 97 and the second oxide layer 96 are etched, using the partial trench 113 (of FIG. 16(b)) to access layers 97 and 96, to form MTJ trench 106. After etching, the trench 106 extends substantially downward such that the top "cap" of hard mask layer 93 is exposed, and the walls of trench 106 are comprised of second oxide layer 96, second shielding layer 97, and the fourth photo-resist layer 107. In an exemplary embodiment of the present invention, MTJ trench 106 measures approximately 1000 Angstroms wide. In some embodiments, RIE is used when performing the etching step. Etching the second shielding layer 97 and the second oxide layer 96 stops at the hard mask layer 93 due to the characteristics of the hard mask layer 93.

Figure 17:
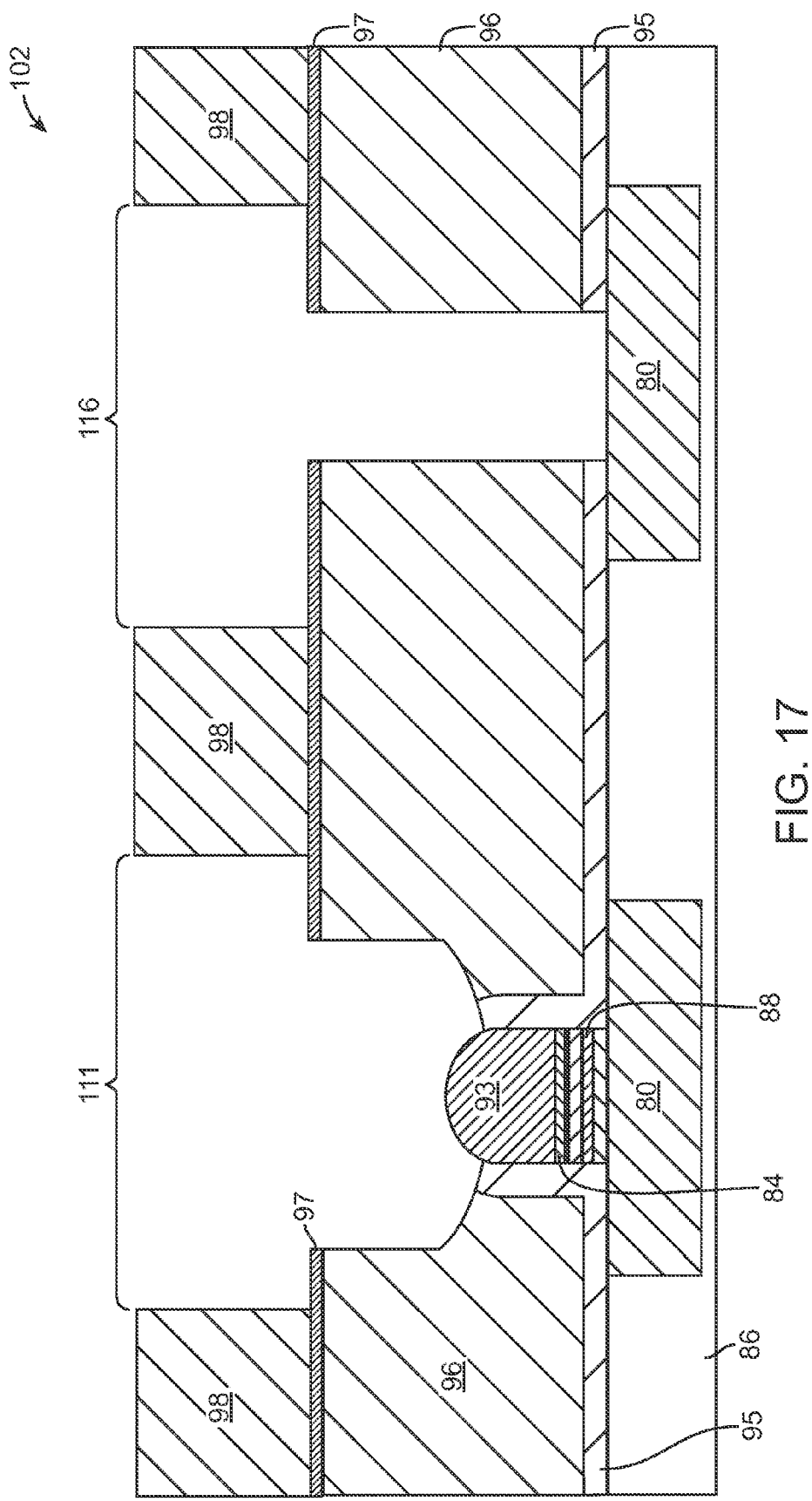
FIG. 17 shows a cross sectional view of memory cell 102 after Step 40 is completed.
Figure 18:
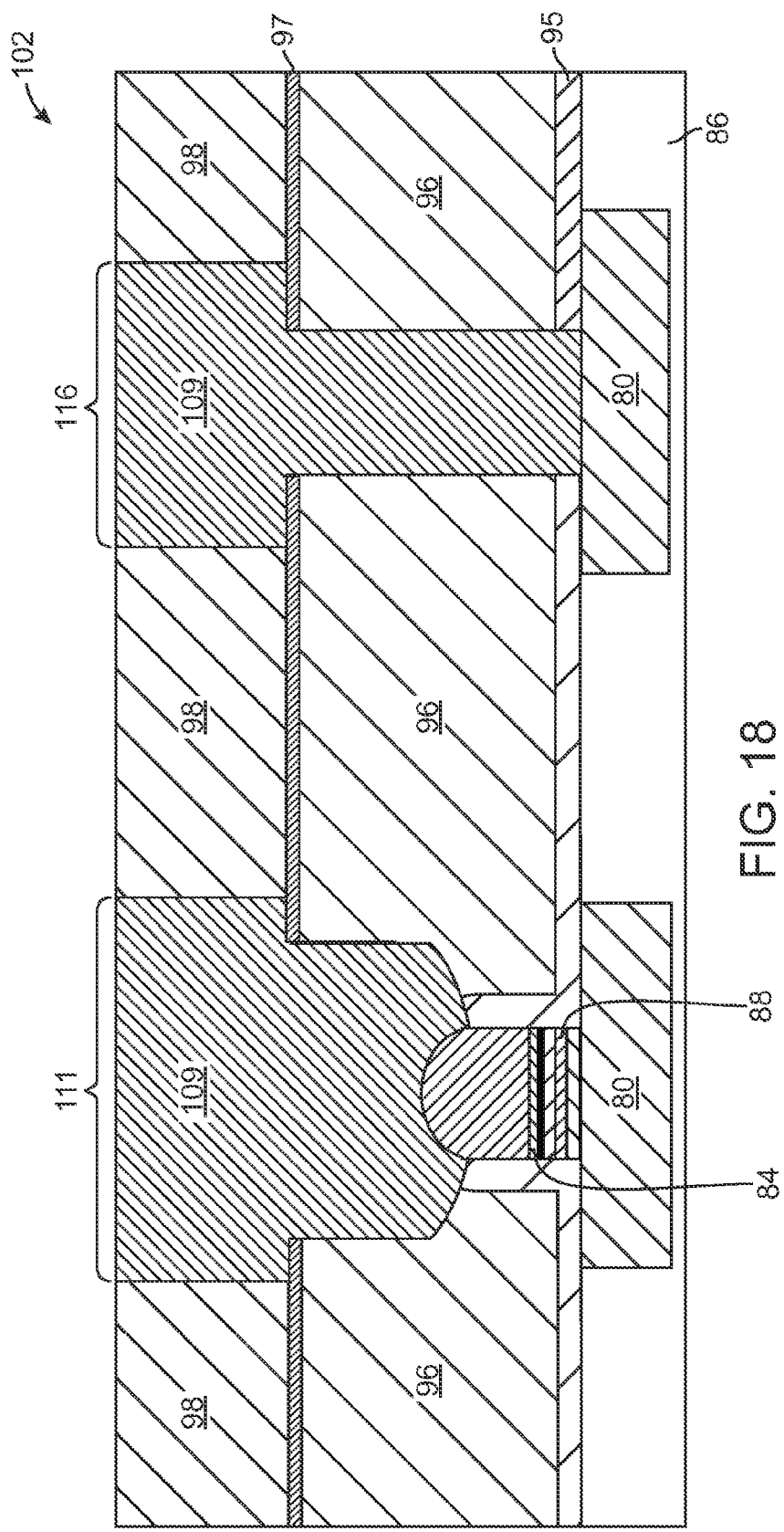
FIG. 18 shows a cross sectional view of memory cell 102 after Step 41 is completed.

FIG. 17 shows a cross sectional view of memory cell 102 after Step 40 (of FIG. 1) is completed. Memory cell 102 is shown to include CMOS wafer 86, conductive layer 80, MTJ stack 88, tantalum layer 84, hard mask layer 93, shielding layer 95, second oxide layer 96, second shielding layer 97, third hard layer 98, MTJ trench 111, and trench via 116.

At Step 40, the fourth photo-resist layer 107 is removed. The memory cell 102 is cleaned (or ashed) to remove the remaining fourth photo-resist layer 107. In an exemplary embodiment of the present invention, plasma ashing is used to remove the remaining fourth photo-resist layer 107.

FIG. 16 shows a cross sectional view of memory cell 102 after Step 41 (of FIG. 1) is completed. Memory cell 102 is shown to include CMOS wafer 86, conductive layer 80, MTJ stack 88, tantalum layer 84, hard mask layer 93, shielding layer 95, second oxide layer 96, second shielding layer 97, third oxide layer 98, MTJ trench 111, via trench 116, and second conductive layer 109.

At Step 41, a barrier metal layer 108 is deposited on top of the wafer. The barrier metal layer 108 is necessary to prevent copper diffusion into the dielectric layer of CMOS wafer 86. Next, a second conductive layer 109 is deposited by electrolysis. At Step 41, a Dual Damascene process is used. In this process, both the MTJ trench 111 and via trench 116 are fabricated before the deposition of the second conductive layer 109, thereby filling both the MTJ trench 111 and the partial trench 112 in a single step. Dual Damascene process is well known to those skilled in the art. Next, the CMP process is performed to substantially level the top of the third oxide layer 98 and the second conductive layer 109. In an exemplary embodiment, the second conductive layer 109 is made of copper.

After Step 44, a passivation nitride layer and a passivation oxide layer are deposited substantially atop memory cell 102. Both depositions are applied in low temperature. The deposition temperature is below 300 C. This deposition temperature is lower than the normal deposition temperature of 470 C. Next, a pad mask is used to expose the photo-resist covering the memory cell 102. Finally, a passivation etch is performed. The passivation process, and passivation etch steps listed above are well known to one skilled in the art.

In some embodiments, the memory cell 102 includes memory elements shown and discussed in U.S. patent application Ser. No. 11/674,124, entitled "Non-Uniform Switching Based Non-Volatile Magnetic Based Memory," filed Feb. 12, 2007, by Ranjan, et al.; U.S. patent application Ser. No. 11/678,515, entitled "A High Capacity Low Cost Multi-State Magnetic Memory," filed Feb. 23, 2007, by Ranjan, et al.; and U.S. patent application Ser. No. 11/776,692, entitled "Non-Volatile Magnetic Memory Element with Graded Layer," filed Jul. 12, 2007, by Ranjan et al., all of which are incorporated herein by reference as though set forth in full.

It is understood that the figures shown and referred to herein are not drawn to scale. Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A magnetic random access memory cell, comprising:
   a complimentary metal-oxide-semiconductor (CMOS) wafer;
   a conductive layer formed on top of the CMOS wafer;
   a magnetic tunnel junction (MTJ) centered on top of the conductive layer;
   a hard mask layer, formed on top of the MTJ; and
   a shielding layer, wherein the shielding layer covers the hard mask layer, the sides of the MTJ, and the exposed portion of the conductive layer.

2. A magnetic random access memory cell, as recited in claim 1, further comprising:
   a oxide layer, formed on top of the shielding layer;
   a second shielding layer, formed on top of the oxide layer;
   a second oxide layer, formed on top of the second shielding layer;
   a second conductive layer; and
   a MTJ trench, wherein the trench is filled with the second conductive layer, and the trench spans from the top of the second oxide layer down through the second oxide layer, second shielding layer, oxide layer, and first shielding layer such that the top of the hard mask layer forms the bottom of MTJ trench.

3. A magnetic random access memory cell, as recited in claim 1, further comprising:
   a via trench, wherein the trench is filled with the second conductive layer, and the trench spans from the top of the second oxide layer down through the second oxide layer, second shielding layer, oxide layer, and first shielding layer such that the conductive layer forms the bottom of the via trench.

* * * * *